(12) United States Patent
Narumi

(10) Patent No.: US 10,658,947 B2
(45) Date of Patent: May 19, 2020

(54) SEMICONDUCTOR DEVICE, POWER MODULE, AND CONTROL METHOD OF POWER CONVERSION DEVICE

(71) Applicant: Renesas Electronics Corporation, Tokyo (JP)

(72) Inventor: Satoshi Narumi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 58 days.

(21) Appl. No.: 16/000,643

(22) Filed: Jun. 5, 2018

(65) Prior Publication Data

US 2019/0007039 A1    Jan. 3, 2019

(30) Foreign Application Priority Data

Jun. 30, 2017  (JP) ................................ 2017-129113

(51) Int. Cl.
| | |
|---|---|
| *H02M 7/538* | (2007.01) |
| *H02M 7/5387* | (2007.01) |
| *H02M 7/537* | (2006.01) |
| *H02M 7/539* | (2006.01) |
| *H02M 1/32* | (2007.01) |

(52) U.S. Cl.
CPC ....... *H02M 7/53871* (2013.01); *H02M 7/537* (2013.01); *H02M 7/539* (2013.01); *H02M 2001/327* (2013.01)

(58) Field of Classification Search
CPC ............................................. H02M 7/537–539
See application file for complete search history.

(56) References Cited

U.S. PATENT DOCUMENTS

| | | | |
|---|---|---|---|
| 6,288,597 B1 | 9/2001 | Hasegawa et al. | |
| 2009/0058336 A1* | 3/2009 | Narumi | H02P 6/182 |
| | | | 318/400.06 |
| 2009/0153086 A1* | 6/2009 | Narumi | H02P 6/18 |
| | | | 318/400.35 |
| 2010/0072967 A1* | 3/2010 | Kamishinbara | H02M 3/158 |
| | | | 323/284 |
| 2010/0328831 A1 | 12/2010 | Zhang et al. | |
| 2013/0278200 A1* | 10/2013 | Fujii | H02P 21/06 |
| | | | 318/722 |

FOREIGN PATENT DOCUMENTS

| | | |
|---|---|---|
| DE | 10 2015 222 990 A1 | 5/2017 |
| JP | 2000-124781 A | 4/2000 |
| JP | 2006-114575 A | 4/2006 |

OTHER PUBLICATIONS

European Search Report dated Nov. 9, 2018 for European Patent Application No. 18178686.4-1203.

* cited by examiner

*Primary Examiner* — Fred E Finch, III
*Assistant Examiner* — Rafael O. León Domenech
(74) *Attorney, Agent, or Firm* — McDermott Will & Emery LLP

(57) ABSTRACT

The junction temperature of a field effect transistor is detected with a higher degree of accuracy than in the past. A semiconductor device controls multiple field effect transistors that configure a power conversion device, and includes a differential amplifier and a controller that controls ON/OFF of the multiple field effect transistors. The differential amplifier detects the potential difference between a source and a drain of a field effect transistor that is controlled in the OFF state by the controller and that induces an electric current flowing through the body diode thereof, among the multiple field effect transistors.

13 Claims, 13 Drawing Sheets

SEMICONDUCTOR DEVICE, POWER MODULE, AND CONTROL METHOD OF POWER CONVERSION DEVICE

CROSS-REFERENCE TO RELATED APPLICATIONS

The disclosure of Japanese Patent Application No. 2017-129113 filed on Jun. 30, 2017 including the specification, drawings, and abstract is incorporated herein by reference in its entirety.

BACKGROUND

The present disclosure relates to a semiconductor device, a power module, and a control method of a power conversion device, and it is suitably applied to a semiconductor device to control power conversion devices, such as an inverter device.

Various methods have been used as a real-time detection method of the temperature of a switching semiconductor element that configures a power module. The method generally used detects the surface temperature rise of a power module by means of a temperature detection circuit with a thermistor (refer to "Related Art" of Patent Literature 1).

Another method commonly known detects the temperature of a semiconductor element, by utilizing the temperature characteristic of an internal gate resistor that is coupled between a gate electrode of the semiconductor element and a gate terminal of the power module (refer to "Summary" of Patent Literature 1).

Yet another method known detects the temperature of a semiconductor chip, based on the temperature characteristic of a temperature detecting diode that is provided over the surface of the semiconductor chip (refer to Patent Literature 2).

(Patent Literature 1) Japanese Unexamined Patent Application Publication No. 2000-124781

(Patent Literature 2) Japanese Unexamined Patent Application Publication No. 2006-114575

SUMMARY

Each of the above-described methods in the past has a problem in the detection accuracy of the temperature of a semiconductor element. Specifically, in the case of the method of detecting the surface temperature of a power module using a thermistor, the temperature detected with the thermistor is the temperature of a case of the power module (hereinafter called a case temperature). Heat is conducted slowly from the junction of the semiconductor element as a heat source to the case of the power module; accordingly, it is likely that the case temperature is lower than the junction temperature. Therefore, it is necessary to estimate the junction temperature of the semiconductor element from the detection temperature, and the energization to the semiconductor element must be stopped before the detection temperature reaches 150° C. as the failure temperature of a Si semiconductor element.

In the case of the method to provide a resistive element or a diode inside the power module, it is possible to obtain the temperature detection value that is closer to the junction temperature rather than the case temperature. However, the detection temperature is not the junction temperature itself. Therefore, also in this case, it is necessary to estimate the junction temperature based on the detection temperature, leaving a problem in regard to the measurement accuracy.

The other issues and new features of the present invention will become clear from the description of the present specification and the accompanying drawings.

A semiconductor device according to one embodiment controls multiple field effect transistors configuring a power conversion device, and includes a controller to control ON/OFF of each of the multiple field effect transistors, and a differential amplifier. The differential amplifier detects potential difference between a source and a drain of a field effect transistor in which an electric current flows via a body diode thereof because of being set to an OFF state by the controller, among the multiple field effect transistors.

According to the present embodiment, it is possible to detect the junction temperature of a field effect transistor with a higher degree of accuracy than in the past.

DETAILED DESCRIPTION

Hereinafter, each embodiment is explained in detail with reference to drawings. The same reference number or symbol is given to the same or corresponding part, and the explanation thereof is not repeated.

Embodiment 1

(Temperature Detection Method)

Figure 1A:
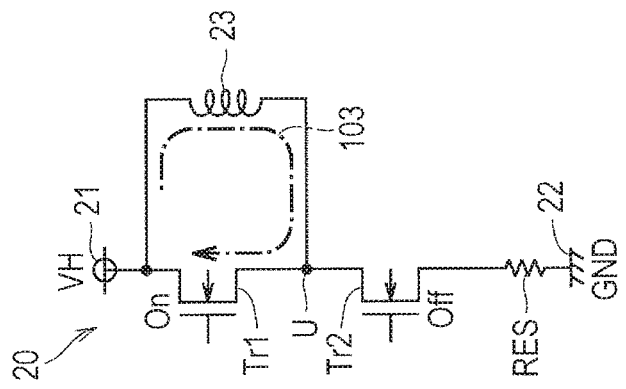
FIGS. 1A, 1B, and 1C are drawings illustrating a temperature detection method of a semiconductor element according to Embodiment 1.
Figure 1B:
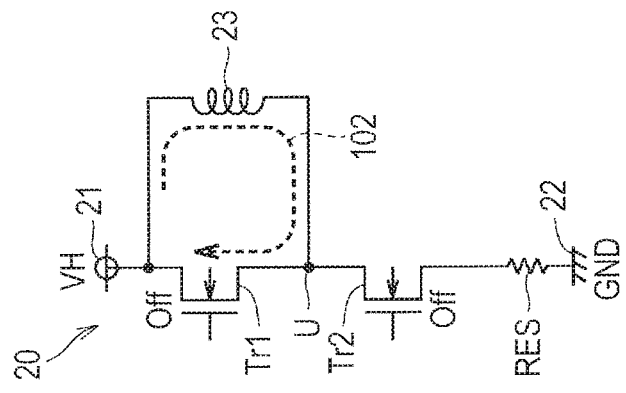
Figure 1C:
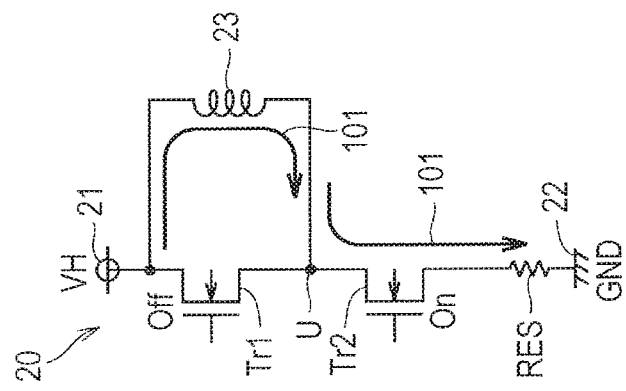

FIGS. 1A, 1B, and 1C illustrate a temperature detection method of a semiconductor element according to Embodiment 1. In the present embodiment, a half bridge circuit 20 comprised of insulated-gate field effect transistors (FETs) Tr1 and Tr2 as a semiconductor element is exemplified. The half bridge circuit 20 configures at least a part of a power conversion device for example, and is controlled by pulse width modulation.

With reference to FIGS. 1A, 1B, and 1C, the half bridge circuit 20 is comprised of the field effect transistor Tr1 coupled between a high potential node 21 and a coupling node U, and the field effect transistor Tr2 coupled between the coupling node U and a ground node 22. A high potential VH is supplied to the high potential node 21, and a ground potential GND is supplied to the ground node 22. An inductor 23 as a load is coupled between the coupling node U and the high potential node 21.

The field effect transistor Tr1 configures an upper arm of the half bridge circuit 20, and the field effect transistor Tr2 configures a lower arm of the half bridge circuit 20. In the case of FIGS. 1A, 1B, and 1C, each of the field effect transistor Tr1 and the field effect transistor Tr2 is an N-type MISFET (Metal Insulator Semiconductor FET). The MISFET includes an MOSFET (Metal Oxide Semiconductor FET) of which the insulator is formed with an oxide. Therefore, a drain electrode (D) of the field effect transistor Tr1 is coupled to the high potential node 21, and a source electrode (S) of the field effect transistor Tr1 is coupled to the coupling node U. A drain electrode (D) of the field effect transistor Tr2 is coupled to the coupling node U, and a source electrode (S) of the field effect transistor Tr2 is coupled to the ground node 22 via a shunt resistor RES.

With reference to FIG. 1A, it is assumed that the field effect transistor Tr1 is in an OFF state and the field effect transistor Tr2 is in an ON state. In this case, an energization current 101 flows from the high potential node 21 to the ground node 22, passing an inductor 23, the coupling node U, and the field effect transistor Tr2 in order.

With reference to FIG. 1B, it is assumed that the field effect transistor Tr2 is set to an OFF state from the state of FIG. 1A. In this case, a circulating current 102 (also called a regenerative current) flows from the high potential node 21, passing an inductor 23 and a body diode of the field effect transistor Tr1 in order, and reaching the high potential node 21 again. The body diode will be explained in detail with reference to FIG. 2 and FIG. 3.

With reference to FIG. 1C, it is assumed that the field effect transistor Tr1 is set to an ON state from the state of FIG. 1B. In this case, a circulating current 103 flows from the high potential node 21, passing the inductor 23 and a channel region of the field effect transistor Tr1 in order, and reaching the high potential node 21 again.

When performing PWM control of the inductor 23, the state illustrated in FIG. 1A and the state illustrated in FIG. 1C are repeated alternately. In this case, it is necessary to prevent a flow-through current from flowing between the high potential node 21 and the ground node 22 via the field effect transistors Tr1 and Tr2 both in an ON state. Therefore, the state illustrated in FIG. 1B is inserted between the state illustrated in FIG. 1A and the state illustrated in FIG. 1C. The state illustrated in FIG. 1B is a period called "dead time."

In the temperature detection of the semiconductor element according to the present disclosure, the voltage between a source and a drain of the field effect transistor (that is, a forward voltage between an anode and a cathode of the body diode) is detected in this dead time (that is, in the state when a circulating current flows through the body diode). The forward voltage of the body diode decreases as the temperature rises. Therefore, by detecting the forward voltage of the body diode, it is possible to detect correctly the junction temperature of the semiconductor element. Specifically, the forward voltage of the body diode is detected in the dead time in process of shifting from the state where the energization current 101 illustrated in FIG. 1A flows to the state where the circulating current 103 illustrated in FIG. 1C flows.

(Body Diode)

Figure 2:
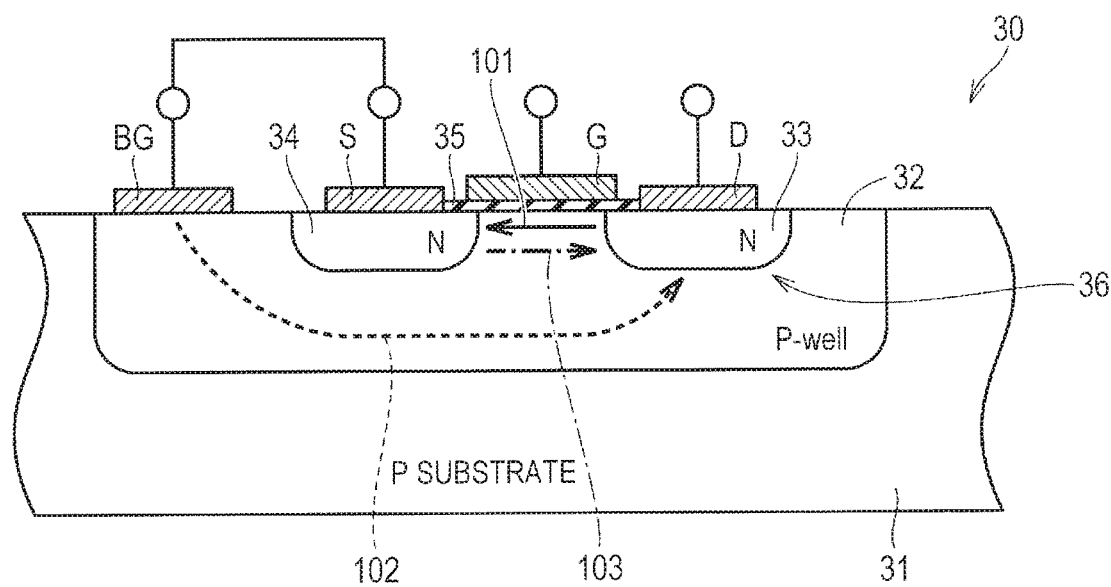
FIG. 2 is a sectional view illustrating an example of the configuration of a horizontal-type MISFET.

Hereinafter, the body diode of the field effect transistor is explained. FIG. 2 explains about a horizontal-type MISFET, and FIG. 3 explains about a vertical-type MISFET.

FIG. 2 is a sectional view illustrating an example of the configuration of a horizontal-type MISFET. With reference to FIG. 2, the horizontal-type MISFET 30 is comprised of a P-type semiconductor substrate 31, a P-type diffusion region (P-well) 32 formed in a part of the upper part of the P-type semiconductor substrate 31, and N-type impurity regions 33 and 34 formed in a part of the upper part of the P-type diffusion region 32. A body diode 36 is formed by the P-type diffusion region 32 and the N-type impurity region 33.

The horizontal-type MISFET 30 is further comprised of a drain electrode D formed over the surface of the N-type impurity region 33, a source electrode S formed over the surface of the N-type impurity region 34, a gate electrode G formed between the drain electrode D and the source electrode S, and a back gate electrode BG formed over the surface of the P-type diffusion region 32. The gate electrode G is coupled to the surface of the P-type diffusion region 32 and the surface of the N-type impurity regions 33 and 34, through the intervention of a gate insulating film 35. The source electrode S and the back gate electrode BG are mutually coupled via wiring.

In the configuration of the horizontal-type MISFET 30 illustrated in FIG. 2, when a gate voltage greater than a threshold voltage is applied to the gate electrode G, the energization current 101 flows from the drain electrode D to the source electrode S, passing the N-type impurity region 33, the N-type channel region formed in the upper part of the P-type diffusion region 32, and the N-type impurity region 34 in order. Alternatively, the circulating current 103 flows from the source electrode S to the drain electrode D, passing the N-type impurity region 34, the N-type channel region, and the N-type impurity region 33 in order.

On the other hand, in the configuration of the horizontal-type MISFET 30 illustrated in FIG. 2, when the gate voltage greater than the threshold voltage is not applied to the gate electrode G and the horizontal-type MISFET 30 is in an OFF state, the circulating current 102 can flow in the direction from the back gate electrode BG to the drain electrode D, passing the P-type diffusion region 32 and the N-type impurity region 33 in order. Therefore, it is possible to detect the junction temperature of the horizontal-type MISFET 30 by detecting the source-drain voltage of the horizontal-type MISFET 30 (that is, the forward voltage of the body diode 36) in the state where this circulating current 102 is flowing.

Figure 3:
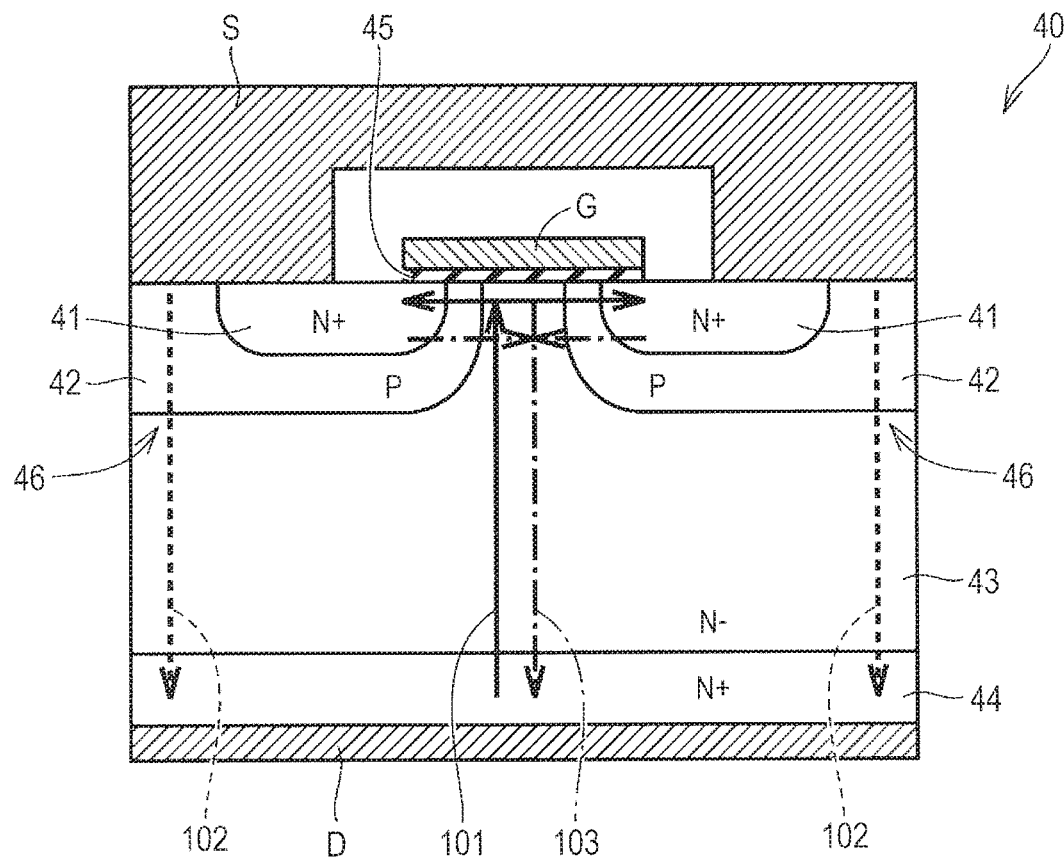
FIG. 3 is a sectional view illustrating an example of the configuration of a vertical-type MISFET.

FIG. 3 is a sectional view illustrating an example of the configuration of a vertical-type MISFET. With reference to FIG. 3, the vertical-type MISFET 40 is comprised of a high-concentration N(+)-type drain layer 44, a low-concentration N(−)-type drift layer 43 formed in the upper part of the N(+)-type drain layer 44, a P-type base layer 42 formed in a part of the upper part of the N(−)-type drift layer 43, and a high-concentration N(+)-type source layer 41 formed in a part of the upper part of the P-type base layer 42. A body diode 46 is formed by the P-type base layer 42 and the N(−)-type drift layer 43.

Furthermore, in the vertical-type MISFET 40, a gate electrode G is formed over a part of the surface of the N(+)-type source layer 41, a part of the surface of the P-type base layer 42, and a part of the surface of the N(−)-type drift layer 43, with the intervention of the gate insulating film 45. At the same time, a source electrode S is formed over a part of the surface of the N(+)-type source layer 41 and a part of the surface of the P-type base layer 42. Furthermore, in the vertical-type MISFET 40, a drain electrode D is formed over the surface of the N(+)-type drain layer 44 on the opposite side of the source electrode S.

In the vertical-type MISFET 40 configured as illustrated in FIG. 3, when a gate voltage greater than a threshold voltage is applied to the gate electrode G, an energization current 101 flows from the drain electrode D to the source electrode, passing the N(+)-type drain layer 44, the N(−)-type drift layer 43, the N-type channel region of the upper part of the P-type base layer 42, and the N(+)-type source layer 41 in order. Alternatively, the circulating current 103 flows from the source electrode S to the drain electrode D, passing the N(+)-type source layer 41, the N-type channel region of the upper part of the P-type base layer 42, the N(−)-type drift layer 43, and the N(+)-type drain layer 44 in order.

On the other hand, in the configuration of the vertical-type MISFET 40 illustrated in FIG. 3, when the gate voltage greater than the threshold voltage is not applied to the gate electrode G and the vertical-type MISFET 40 is in an OFF state, the circulating current 102 can flow in the direction from the source electrode S to the drain electrode D, passing the P-type base layer 42, the N(−)-type drift layer 43, and the N(+)-type drain layer 44. Therefore, it is possible to detect the junction temperature of the vertical-type MISFET 40 by detecting the source-drain voltage of the vertical-type MISFET 40 (that is, the forward voltage of the body diode 46) in the state where this circulating current 102 is flowing.

(Configuration of the Semiconductor Device)

Next, the following explains an example of the configuration of the semiconductor device that controls the gate voltage of the MISFET and detects the anode-cathode voltage of the body diode.

Figure 4:
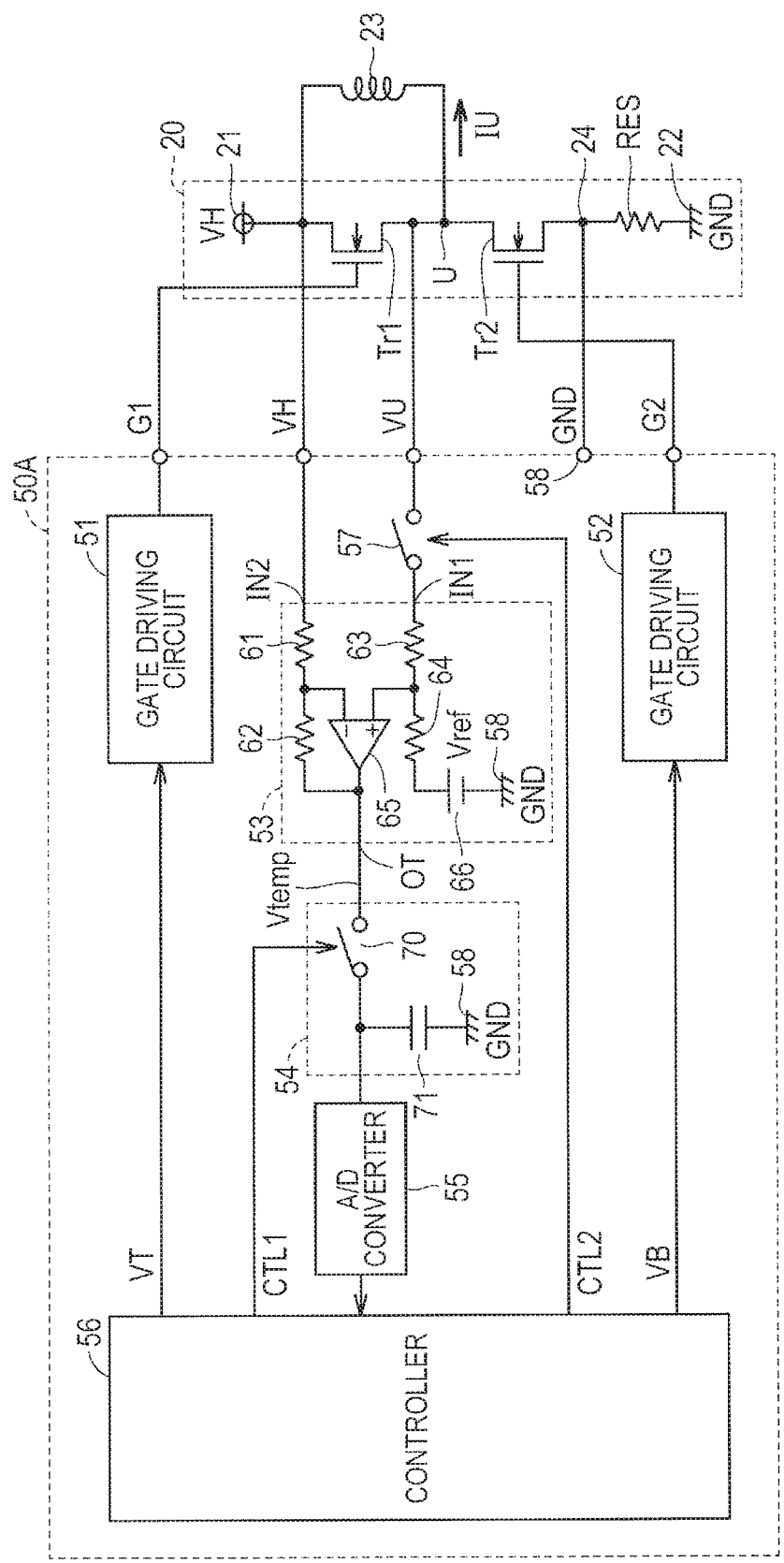
FIG. 4 is a block diagram illustrating the configuration of the semiconductor device according to Embodiment 1.

FIG. 4 is a block diagram illustrating the configuration of the semiconductor device according to Embodiment 1. The semiconductor device 50A illustrated in FIG. 4 controls ON/OFF of the field effect transistors Tr1 and Tr2 that configure the half bridge circuit 20, and detects the anode-cathode voltage of the body diode of the field effect transistor Tr1. The half bridge circuit 20 configures at least a part of the power conversion device. The half bridge circuit 20 and the semiconductor device 50A may configure a part of the power modules.

A load current IU flowing in the direction from a coupling node U of the half bridge circuit 20 to the load 23 is defined as positive. Therefore, the sign of the energization current 101 illustrated in FIG. 1A (that is, the electric current flowing in the direction from the load 23 to the coupling node U of the half bridge circuit 20) is negative.

With reference to FIG. 4, the semiconductor device 50A is comprised of a gate driving circuit 51 on the high potential side, a gate driving circuit 52 on the low potential side, a differential amplifier 53, a sample hold circuit 54, an A/D (Analog to Digital) converter 55, a controller 56, and a switch 57.

The gate driving circuit 51 receives a gate control signal VT from the controller 56. The gate driving circuit 51 converts a reference potential of the gate control signal VT from the ground potential GND to a potential VU of the coupling node U, and amplifies the signal level of the gate control signal VT to generate a drive voltage to be supplied to a gate electrode G1 of the high-potential-side field effect transistor Tr1. ON/OFF of the field effect transistor Tr1 is controlled by the drive voltage supplied to the gate electrode G1 from the gate driving circuit 51.

The gate driving circuit 52 amplifies a gate control signal VB received from the controller 56 to generate a drive voltage to be supplied to a gate electrode G2 of the low-potential-side field effect transistor Tr2. ON/OFF of the field effect transistor Tr2 is controlled by the drive voltage supplied to the gate electrode G2 from the gate driving circuit 52.

The differential amplifier 53 has input nodes IN1 and IN2, and an output node OT. The input node IN1 is coupled to the coupling node U via the switch 57 that switches ON/OFF. Accordingly, the potential VU of the coupling node U is fetched into the input node IN1. The input node IN2 is coupled to the high potential node 21 and fetches the potential VH of the high potential node 21. The output node OT is coupled to the sample hold circuit 54. The differential amplifier 53 outputs, from the output node OT, a voltage signal proportional to the potential difference between the input node IN1 and the input node IN2.

FIG. 4 illustrates an example the differential amplifier 53 comprised of an operational amplifier. As illustrated in FIG. 4, the differential amplifier 53 is comprised of an operational amplifier 65 and resistive elements 61, 62, 63, and 64.

Specifically, the resistive element 61 is coupled between the input node IN2 and the (−) terminal of the operational amplifier 65. The resistive element 62 is coupled between the (−) terminal and an output terminal of the operational amplifier 65 (the output terminal is directly coupled to the output node OT). The resistive element 63 is coupled between the input node IN1 and the (+) terminal of the operational amplifier 65. One end of the resistive element 64 is coupled to the (+) terminal of the operational amplifier 65, and the other end of the resistive element 64 is supplied with a reference voltage Vref on the basis of the ground potential GND.

A terminal 58 for fetching the ground potential GND is provided in the semiconductor device 50A. The terminal 58 is coupled to a coupling node of the field effect transistor Tr2 and a shunt resistor RES (hereinafter the coupling node is called a low potential node 24).

In the configuration of the differential amplifier 53, it is defined that the value of resistance of the resistive elements 61 and 63 is R1 and that the value of resistance of the resistive elements 62 and 64 is R2. Then, a voltage Vtemp outputted from the differential amplifier 53 is given by $$V\text{temp}=(VU-VH)\times R2/R1+V\text{ref} \quad (1)$$

The sample hold circuit 54 is comprised of a switch 70 that switches ON/OFF and a capacitor 71. One end of the switch 70 is coupled to the output node OT of the differential amplifier 53, and the other end of the switch 70 is coupled to one end of the capacitor 71. The other end of the capacitor 71 is supplied with the ground potential GND. The other end of the switch 70 is further coupled to the A/D converter 55.

The A/D converter 55 performs digital conversion of a voltage Vtemp held by the capacitor 71 of the sample hold circuit 54 and outputs the A/D-converted voltage Vtemp to the controller 56.

The controller 56 generates the gate control signals VT and VB, a control signal CTL1 for controlling ON/OFF of the switch 70 of the sample hold circuit 54, and a control signal CTL2 for controlling ON/OFF of the switch 57. The controller 56 performs protected operation, such as setting to OFF all the field effect transistors Tr1 and Tr2, when the voltage Vtemp reaches an upper limit.

In the present embodiment, it is assumed that, when the control signal CTL1 changes from a low level (L level) to a high level (H level), the switch 70 changes from the OFF state to the ON state. It is also assumed that, when the control signal CTL2 changes from the L level to the H level, the switch 57 changes from the OFF state to the ON state. The relation between the logical level of the control signals CTL1 and CTL2, and the corresponding ON/OFF of the switches 70 and 57 may be opposite to the relation described above.

The controller 56 may be configured with a microcomputer including a CPU (Central Processing Unit) and a memory, or may be configured with an FPGA (Field Programmable Gate Array), or may be configured with an exclusive-use circuit. Alternatively, the controller 56 may be configured by combining these circuits arbitrarily.

(Operation of the Semiconductor Device)

Figure 5:
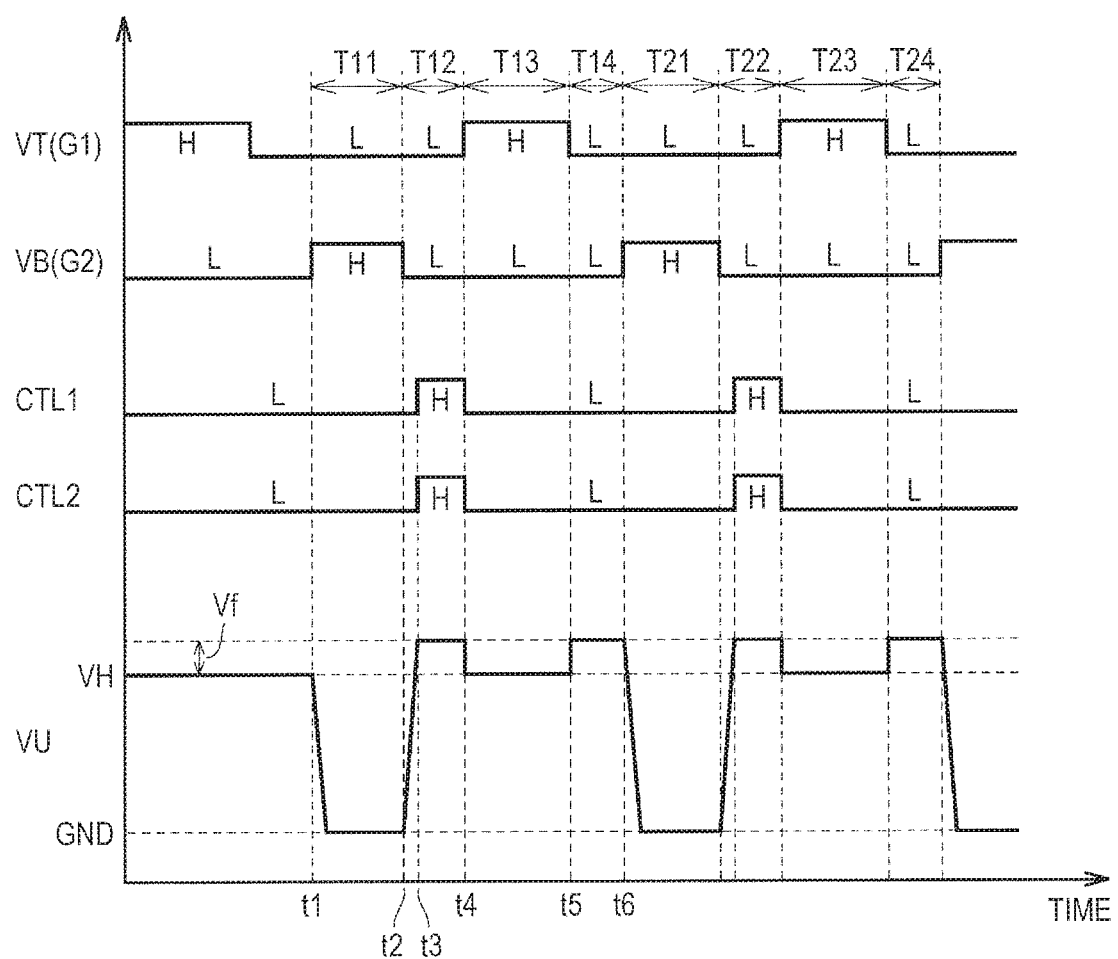
FIG. 5 is a timing chart illustrating operation of the semiconductor device illustrated in FIG. 4.

FIG. 5 is a timing chart illustrating operation of the semiconductor device illustrated in FIG. 4. FIG. 5 illustrates schematically, from the top, the waveforms of the gate control signals VT and VB, the control signals CTL1 and CTL2, and the potential VU at the coupling node U. Hereinafter, with reference to FIG. 4 and FIG. 5 mainly, the operation of the semiconductor device 50A illustrated in FIG. 4 is explained.

Before Time t1, the controller 56 sets the gate control signal VT at the H level and the gate control signal VB at the L level. According to this setting, the high-potential-side field effect transistor Tr1 is controlled in the ON state, and the low-potential-side field effect transistor Tr2 is controlled in the OFF state. As a result, the potential VU of the coupling node U becomes equal to the potential VH of the high potential node 21. It is assumed that, at the point of Time t1, the circulating current 103 illustrated in FIG. 1 has attenuated to 0.

Before Time t1, the controller 56 sets the control signals CTL1 and CTL2 at the L level. Accordingly, the switch 70 of the sample hold circuit 54 and the switch 57 are set in the OFF state.

In Period T11 from Time t1 to Time t2, the controller 56 sets the gate control signal VT at the L level and the gate control signal VB at the H level. According to this setting, the field effect transistor Tr1 is controlled in the OFF state, and the field effect transistor Tr2 is controlled in the ON state. As a result, the potential VU of the coupling node U falls to the ground potential GND. During this Period T11, the energization current 101 illustrated in FIG. 1A flows, and the magnitude of the current increases gradually.

At Time t2, the controller 56 switches the gate control signal VB from the H level to the L level. By this switching, the low-potential-side field effect transistor Tr2 changes from the ON state to the OFF state, and the potential VU of the coupling node U rises from the ground potential GND. During Period T12 from Time t2 to Time t4, the field effect transistors Tr1 and Tr2 are both maintained in the OFF state. During this Period T12, the circulating current 102 illustrated in FIG. 1B flows through the body diode of the field effect transistor Tr1. The potential VU of the coupling node U finally reaches a value that is higher than the potential VH of the high potential node 21, by the forward voltage Vf of the body diode.

Taking into consideration the delay time until the potential VU of the coupling node U reaches the maximum value, the forward voltage Vf of the body diode of the field effect transistor Tr1 is detected, in the period from Time t3 after a prescribed period of time from Time t2 to Time t4. Specifically, the controller 56 sets the control signals CTL1 and CTL2 at the H level, to set the switch 70 of the sample hold circuit 54 and the switch 57 in the ON state. According to this setting, the source-drain voltage of the field effect transistor Tr1 (that is, the forward voltage Vf of the body diode) is detected by the differential amplifier 53. Then, the voltage Vtemp outputted from the differential amplifier 53 is sampled by the sample hold circuit 54 and is held by the capacitor 71. The controller 56 detects the junction temperature of the field effect transistor Tr1 based on the voltage Vtemp held by the capacitor 71.

Here, the voltage detected changes corresponding to the electric current flowing through the body diode. Therefore, it is necessary to control the magnitude of the energization current 101 at Time t2 immediately before being switched to Period T12, to a predetermined value. This value can be adjusted by the length of Period T11 (that is, the duty factor corresponding to a carrier frequency).

At next Time t4, the controller 56 switches the gate control signal VT from the L level to the H level. According to this setting, the state of the high-potential-side field effect transistor Tr1 changes from the OFF state to the ON state. Therefore, as illustrated in FIG. 1C, FIG. 2, and FIG. 3, the path of the circulating current changes to the path (103) that passes the N-type channel region of the field effect transistor Tr1. At Time t4, the controller 56 switches the control signals CTL1 and CTL2 from the H level to the L level, to terminate the sampling of the source-drain voltage of the field effect transistor Tr1. During Period T13 from Time t4 to Time t5, the field effect transistor Tr1 is maintained in the ON state, and the field effect transistor Tr2 is maintained in the OFF state.

At next Time t5, the controller 56 switches the gate control signal VT from the H level to the L level. According to this switching, the state of the high-potential-side field effect transistor Tr1 changes from the ON state to the OFF state. Therefore, as illustrated in FIG. 1B, FIG. 2, and FIG. 3, the path of the circulating current changes to the path (102) that passes the body diode. During Period T14 from Time t5 to Time t6, the field effect transistors Tr1 and Tr2 are both maintained in the OFF state.

Different from the case of Period T12, in Period T14, the sampling of the source-drain voltage of the field effect transistor Tr1 is not performed. The circulating current gradually attenuates in Periods T12, T13, and T14 (it attenuates to 0 depending on conditions); accordingly, it is difficult to make a precise measurement of the forward voltage Vf of the body diode in Period 114. This is the reason of not performing the sampling in Period 114. Therefore, the detection of the junction temperature of the field effect transistor is performed at a time of changing from the energization period to supply the electric power to the load from the power supply to the regeneration period.

Periods T11 to 114 correspond to one cycle of the PWM signal. Periods T21 to 124 as the next one cycle correspond to Periods T11 to 114, respectively, and the same control is repeated. Therefore, the change of the load current IU in Periods T21 to 124 is the same as the change of the load current IU in Periods T11 to 114. Specifically, the load current IU that is 0 at the start time (Time t1) of Period T11 illustrated in FIG. 5 increases in the energization period T11 (from Time t1 to t2), and decreases gradually in the regeneration periods T12, T13, and 114 (from Time t3 to t6). Then, at the end of Period 114 (Time t6), the load current IU starts to increase again. The load current IU increases again in the energization period T21, and decreases gradually in the regeneration periods T22, T23, and 124.

In the case of FIG. 5, in the first dead time period T22 of Periods T21 to 124 as the next one cycle, the control signals CTL1 and CTL2 are set to the H level, to perform remeasurement of the forward voltage Vf of the body diode. The remeasurement described above may be performed several times. In this case, the value obtained by averaging the measurement results of several times may be determined as the final forward voltage Vf.

When the forward voltage Vf is remeasured as shown in FIG. 5, it is desirable to make the measuring condition of the forward voltage Vf the same, in the first measurement in Period T12 and the second measurement in Period T22. Specifically, in order to set the initial value of the load current IU to 0 at the start time (Time t1) of the energization period T11 and at the start time (Time t6) of the energization period T21, it is desirable for the load current IU to attenuate to 0 in the regeneration periods T12, T13, and 114. Furthermore, in order to make the magnitude of the load current IU equal at the measurement start time (that is, at the end of each energization period T11 and T21), it is desirable to make equal the length of the energization period T11 and the length of the energization period T21. Furthermore, it is desirable to make equal the length of Period T12 and the length of Period T22 that are the measurement periods of the forward voltage Vf of the body diode.

(Effect)

As described above, according to the semiconductor device 50A according to Embodiment 1, the junction temperature of the power MISFET is measured based on the temperature characteristic of the body diode of the power MISFET. Therefore, it is possible to measure the junction temperature of the MISFET more accurately than the method used in the past. It is not necessary to employ sensors, such as a thermistor or a diode, for the temperature detection; accordingly, it is possible to reduce the number of parts that configure the system compared with the past.

Modified Example of Embodiment 1

Hereinafter, the following explains an example of measuring the temperature of the low-potential-side field effect transistor Tr2 instead of the high-potential-side field effect transistor Tr1.

(Temperature Detection Method)

Figure 6A:
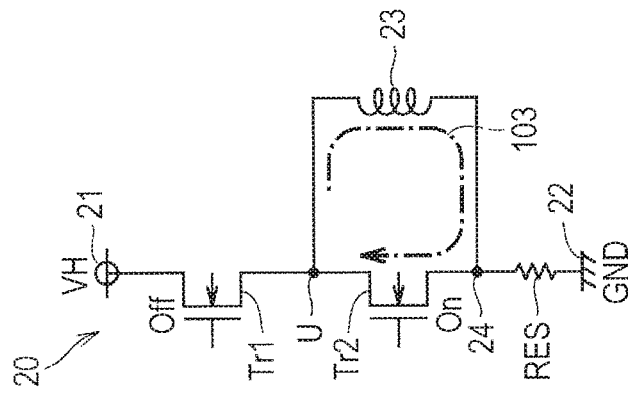
FIGS. 6A, 6B, and 6C are drawings illustrating the temperature detection method of a semiconductor element according to a modified example of Embodiment 1.
Figure 6B:
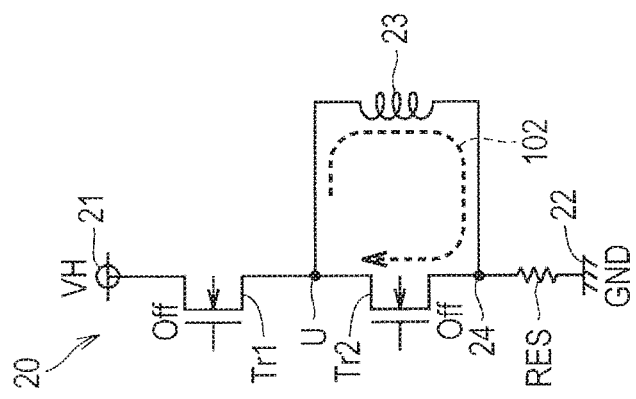
Figure 6C:
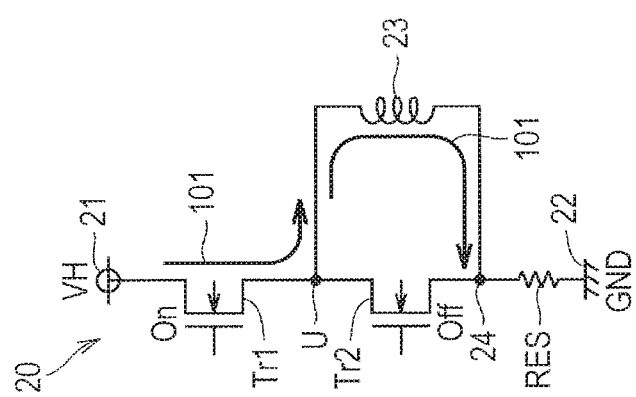

FIGS. 6A, 6B, and 6C illustrate the temperature detection method of the semiconductor element according to the modified example of Embodiment 1. The explanatory drawings illustrated in FIGS. 6A, 6B, and 6C correspond to the explanatory drawings illustrated in FIGS. 1A, 1B, and 1C, and illustrate the half bridge circuit 20 comprised of the field effect transistors Tr1 and Tr2. The half bridge circuit 20 may be considered to configure at least a part of the power conversion device. In the case of FIGS. 6A, 6B, and 6C, the inductor 23 as the load is coupled in parallel with the field effect transistor Tr2, between the coupling node U and the low potential node 24 (the low potential node 24 is a coupling node of the field effect transistor Tr2 and the shunt resistor RES).

With reference to FIG. 6A, it is assumed that the field effect transistor Tr1 is in an ON state and the field effect transistor Tr2 is in an OFF state. In this case, an energization current 101 flows from the high potential node 21 to the ground node 22, passing the field effect transistor Tr1, the coupling node U, the inductor 23, and the low potential node 24 in order.

With reference to FIG. 6B, it is assumed that the field effect transistor Tr1 is set to an OFF state from the state of FIG. 6A. In this case, the circulating current 102 flows from the coupling node U, passing the inductor 23, the low potential node 24, and the body diode of the field effect transistor Tr2 in order, and reaching the coupling node U again.

With reference to FIG. 6C, it is assumed that the field effect transistor Tr2 is set to an ON state from the state of FIG. 1B. In this case, the circulating current 103 flows from the coupling node U, passing the inductor 23, the low potential node 24, the N-type channel region of the field effect transistor Tr2 in order, and reaching the coupling node U again.

When performing PWM control of the inductor 23, the state illustrated in FIG. 6A and the state illustrated in FIG. 6C are repeated alternately. In this case, it is necessary to prevent a flow-through current from flowing between the high potential node 21 and the ground node 22 via the field effect transistors Tr1 and Tr2, both in an ON state. Therefore, the state illustrated in FIG. 6B, that is the period of so-called dead time, is inserted between the state illustrated in FIG. 6A and the state illustrated in FIG. 6C.

In the present embodiment, in the dead time in process of shifting from the state where the energization current 101 illustrated in FIG. 6A flows to the state where the circulating current 103 illustrated in FIG. 6C flows, the source-drain voltage of the field effect transistor Tr2 (that is, the forward voltage between the anode and the cathode of the body diode) is detected. Then, based on the temperature characteristic of the body diode, the junction temperature of the field effect transistor Tr2 is detected.

(Configuration of the Semiconductor Device)

Next, the configuration of the semiconductor device according to the modified example of Embodiment 1 is explained.

Figure 7:
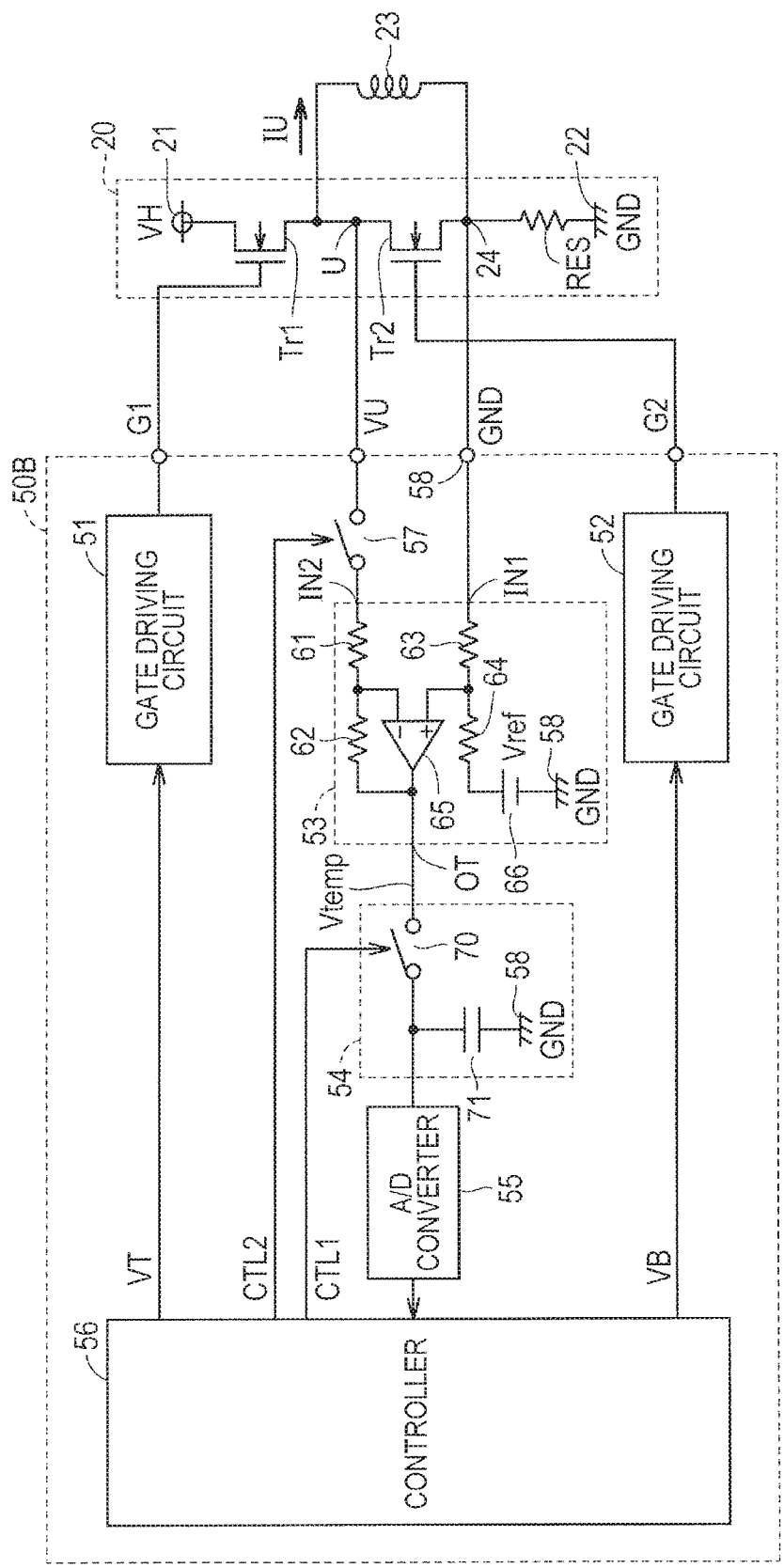
FIG. 7 is a block diagram illustrating the configuration of the semiconductor device according to the modified example of Embodiment 1.

FIG. 7 is a block diagram illustrating the configuration of the semiconductor device according to the modified example of Embodiment 1. A semiconductor device 50B illustrated in FIG. 7 is different from the semiconductor device 50A illustrated in FIG. 4 in the connection of the differential amplifier 53.

Specifically, with reference to FIG. 7, the input node IN1 of the differential amplifier 53 is coupled to the low potential node 24 via the terminal 58. The input node IN2 of the differential amplifier 53 is coupled to the coupling node U via the switch 57. The other configurations illustrated in FIG. 7 are the same as those illustrated in FIG. 4. Therefore, the same reference number or symbol is given to the same or corresponding part, and the explanation thereof is not repeated.

(Operation of the Semiconductor Device)

Figure 8:
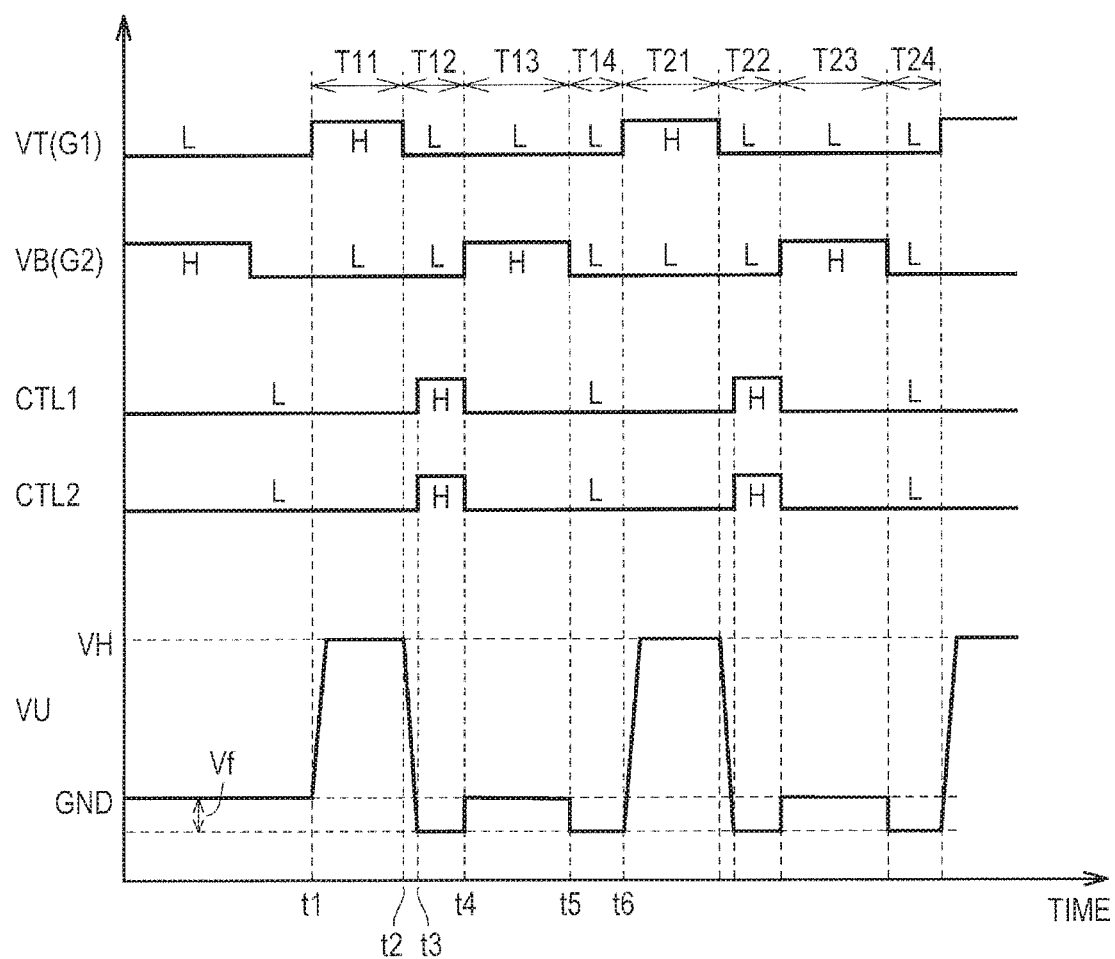
FIG. 8 is a timing chart illustrating operation of the semiconductor device illustrated in FIG. 7.

FIG. 8 is a timing chart illustrating operation of the semiconductor device illustrated in FIG. 7. The timing chart illustrated in FIG. 8 corresponds to the timing chart illustrated in FIG. 5. FIG. 8 illustrates schematically, from the top, the waveforms of the gate control signals VT and VB, the control signals CTL1 and CTL2, and the potential VU at the coupling node U. Hereinafter, with reference to FIG. 7 and FIG. 8 mainly, the operation of the semiconductor device 50B illustrated in FIG. 7 is explained.

Before Time t1, the controller 56 sets the gate control signal VT at the L level and the gate control signal VB at the H level. According to this setting, the high-potential-side field effect transistor Tr1 is controlled in the OFF state and the low-potential-side field effect transistor Tr2 is controlled in the ON state. As a result, the potential VU of the coupling node U becomes equal to the potential of the low potential node 24 (nearly the ground potential GND). It is assumed that, at the point of Time t1, the circulating current 103 illustrated in FIG. 6 has attenuated to 0.

Before Time t1, the controller 56 sets the control signals CTL1 and CTL2 at the L level. Accordingly, the switch 70 of the sample hold circuit 54 and the switch 57 are set in the OFF state.

In Period T11 from Time t1 to Time t2, the controller 56 sets the gate control signal VT at the H level and the gate control signal VB at the L level. According to this setting, the field effect transistor Tr1 is controlled in the ON state, and the field effect transistor Tr2 is controlled in the OFF state. As a result, the potential VU of the coupling node U rises to the potential VH of the high potential node 21. During this Period T11, the energization current 101 illustrated in FIG. 6A flows, and the magnitude of the current increases gradually.

At Time t2, the controller 56 switches the gate control signal VT from the H level to the L level. According to this switching, the high-potential-side field effect transistor Tr1 changes from the ON state to the OFF state, and the potential VU of the coupling node U falls from the potential VH of the high potential node 21. During Period T12 from Time t2 to Time t4, the field effect transistors Tr1 and Tr2 are both maintained in the OFF state. During this Period T12, the circulating current 102 illustrated in FIG. 6B flows through the body diode of the field effect transistor Tr2. Therefore, after the lapse of a delay time, the potential VU of the coupling node U finally reaches a value that is lower than the potential of the low potential node 24 (that is, the ground potential GND), by the forward voltage Vf of the body diode.

From Time t3 after the lapse of the prescribed period of time from Time t2 to Time t4, the controller 56 sets the control signals CTL1 and CTL2 at the H level, to set the switch 70 of the sample hold circuit 54 and the switch 57 in the ON state. According to this setting, the source-drain voltage of the field effect transistor Tr2 (that is, the forward voltage Vf of the body diode) is detected by the differential amplifier 53. Then, the voltage Vtemp outputted from the differential amplifier 53 is sampled by the sample hold circuit 54 and is held by the capacitor 71. The controller 56 detects the junction temperature of the field effect transistor Tr2 based on the voltage Vtemp held by the capacitor 71.

At next Time t4, the controller 56 switches the gate control signal VB from the L level to the H level. According to this switching, the low-potential-side field effect transistor Tr2 changes from the OFF state to the ON state. Therefore, as illustrated in FIG. 6C, FIG. 2, and FIG. 3, the path of the circulating current changes to the path (103) that passes the N-type channel region of the field effect transistor Tr2. At Time t4, the controller 56 switches the control signals CTL1 and CTL2 from the H level to the L level, to terminate the sampling of the source-drain voltage of the field effect transistor Tr2. During Period T13 from Time t4 to Time t5, the field effect transistor Tr1 is maintained in the OFF state, and the field effect transistor Tr2 is maintained in the ON state.

At next Time t5, the controller 56 switches the gate control signal VB from the H level to the L level. According to this switching, the low-potential-side field effect transistor Tr2 changes from the ON state to the OFF state. Therefore, as illustrated in FIG. 6B, FIG. 2, and FIG. 3, the path of the circulating current changes to the path (102) that passes the body diode. During Period T14 from Time t5 to Time t6, the field effect transistors Tr1 and Tr2 are both maintained in the OFF state. Different from the case of Period T12, in Period 114, the sampling of the source-drain voltage of the field effect transistor Tr1 is not performed.

Periods T11 to 114 correspond to one cycle of the PWM signal. Periods T21 to 124 correspond to Periods T11 to 114, respectively, and the same control is repeated.

(Effect)

By the semiconductor device 50B according to the modified example of Embodiment 1, it is possible to produce the same effect as produced by the semiconductor device 50A according to Embodiment 1.

Embodiment 2

In Embodiment 2, the explanation is made for an example in which a motor-controlling inverter device 25 as a power conversion device is controlled by a semiconductor device 50C.

(Configuration of the Semiconductor Device)

Figure 9:
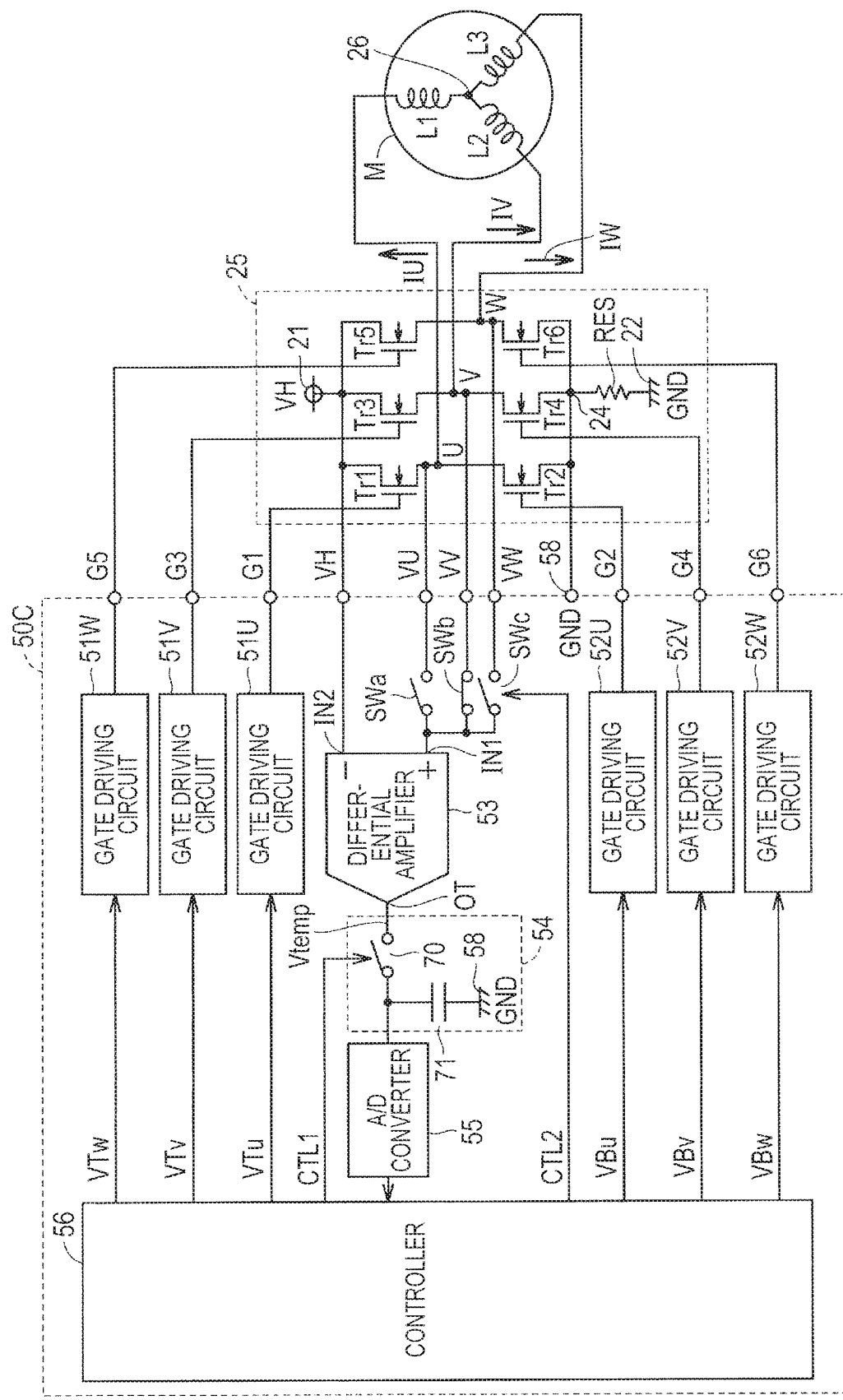
FIG. 9 is a block diagram illustrating the configuration of a semiconductor device according to Embodiment 2.

FIG. 9 is a block diagram illustrating the configuration of the semiconductor device according to Embodiment 2. The semiconductor device 50C illustrated in FIG. 9 controls ON/OFF of field effect transistors Tr1 to Tr6 that configure the inverter device 25 (also called a three-phase bridge circuit) as the power conversion device, and detects the cathode-to-anode voltage of a body diode of the field effect transistors Tr1, Tr3, and Tr5 of the upper arm. The semiconductor device 50C and the inverter device 25 may be configured as a part of the power module.

With reference to FIG. 9, the three-phase motor M is a three-phase synchronous motor or a brushless DC motor. The three-phase motor M includes star-connected stator windings L1, L2, and L3.

The inverter device 25 is comprised of the field effect transistors Tr1 and Tr2 for generating a U-phase motor current IU, the field effect transistors Tr3 and Tr4 for generating a V-phase motor current IV, and the field effect transistors Tr5 and Tr6 for generating a W-phase motor current IW. In the case illustrated in FIG. 9, the field effect transistors Tr1 to Tr6 are all N-type MISFETs.

More specifically, the field effect transistor Tr1 is coupled between the high potential node 21 and the coupling node U, and the field effect transistor Tr2 is coupled between the coupling node U and the low potential node 24. The coupling node U is coupled to one end of the stator winding L1, and the other end of the stator winding L1 is coupled to a neutral point 26. The low potential node 24 is coupled to the ground node 22 via the shunt resistor RES.

In the same manner, the field effect transistor Tr3 is coupled between the high potential node 21 and a coupling node V, and the field effect transistor Tr4 is coupled between the coupling node V and the low potential node 24. The coupling node V is coupled to one end of the stator winding L2, and the other end of the stator winding L2 is coupled to the neutral point 26.

In the same manner, the field effect transistor Tr5 is coupled between the high potential node 21 and a coupling node W, and the field effect transistor Tr6 is coupled between the coupling node W and the low potential node 24. The coupling node W is coupled to one end of the stator winding L3, and the other end of the stator winding L3 is coupled to the neutral point 26.

When the motor currents IU, IV, and IW flow in the direction from the inverter device 25 to the three-phase motor M, the sign of the motor currents IU, IV, and IW is defined as positive.

The Semiconductor device 50C is comprised of high-potential-side gate driving circuits 51U, 51V, and 51W, low-potential-side gate driving circuits 52U, 52V, and 52W, a differential amplifier 53, a sample hold circuit 54, an A/D (Analog to Digital) converter 55, a controller 56, and switches SWa, SWb, and SWc.

The gate driving circuit 51U receives a gate control signal VTu from the controller 56. The gate driving circuit 51U converts a reference potential of the gate control signal VTu from the ground potential GND to a potential VU of the coupling node U, and amplifies the signal level of the gate control signal VTu to generate a drive voltage to be supplied to a gate electrode G1 of the high-potential-side field effect transistor Tr1. ON/OFF of the field effect transistor Tr1 is controlled by the drive voltage supplied to the gate electrode G1 from the gate driving circuit 51U.

In the same manner, the gate driving circuit 51V receives a gate control signal VTv from the controller 56. The gate driving circuit 51V converts a reference potential of the gate control signal VTv from the ground potential GND to a potential VV of the coupling node V, and amplifies the signal level of the gate control signal VTv to generate a drive voltage to be supplied to a gate electrode G3 of the high-potential-side field effect transistor Tr3. ON/OFF of the field effect transistor Tr3 is controlled by the drive voltage supplied to the gate electrode G3 from the gate driving circuit 51V.

In the same manner, the gate driving circuit 51W receives a gate control signal VTw from the controller 56. The gate driving circuit 51W converts a reference potential of the gate control signal VTw from the ground potential GND to a potential VW of the coupling node W, and amplifies the signal level of the gate control signal VTw to generate a drive voltage to be supplied to a gate electrode G5 of the high-potential-side field effect transistor Tr5. ON/OFF of the field effect transistor Tr5 is controlled by the drive voltage supplied to the gate electrode G5 from the gate driving circuit 51W.

The gate driving circuit 52U amplifies a gate control signal VBu received from the controller 56 to generate a drive voltage to be supplied to a gate electrode G2 of the low-potential-side field effect transistor Tr2. ON/OFF of the field effect transistor Tr2 is controlled by the drive voltage supplied to the gate electrode G2 from the gate driving circuit 52U.

In the same manner, the gate driving circuit 52V amplifies a gate control signal VBv received from the controller 56 to generate a drive voltage to be supplied to a gate electrode G4 of the low-potential-side field effect transistor Tr4. ON/OFF of the field effect transistor Tr4 is controlled by the drive voltage supplied to the gate electrode G4 from the gate driving circuit 52V.

In the same manner, the gate driving circuit 52W amplifies a gate control signal VBw received from the controller 56 to generate a drive voltage to be supplied to a gate electrode G6 of the low-potential-side field effect transistor Tr6. ON/OFF of the field effect transistor Tr6 is controlled by the drive voltage supplied to the gate electrode G6 from the gate driving circuit 52W.

The differential amplifier 53 has the same configuration as the differential amplifier 53 explained in FIG. 4. The differential amplifier 53 outputs, from the output node OT, a voltage signal proportional to the potential difference between the input node IN1 and the input node IN2.

More specifically, the input node IN1 of the differential amplifier 53 is coupled to the coupling node U via the switch SWa that switches ON/OFF and can fetch the potential VU of the coupling node U. In the same manner, the input node IN1 of the differential amplifier 53 is coupled to the coupling node V via the switch SWb that switches ON/OFF and can fetch the potential VV of the coupling node V. In the same manner, the input node IN1 of the differential amplifier 53 is coupled to the coupling node W via the switch SWc that switches ON/OFF and can fetch the potential VW of the coupling node W. The input node IN2 is coupled to the high potential node 21 and fetches the potential VH of the high potential node 21. The output node OT is coupled to the sample hold circuit 54. The differential amplifier 53 outputs, from the output node OT, a voltage signal proportional to the potential difference between the input node IN1 and the input node IN2.

The configuration of the sample hold circuit 54 is the same as in FIG. 4; therefore, the explanation thereof is not repeated. The A/D converter 55 performs digital conversion of a voltage Vtemp held by the capacitor 71 of the sample hold circuit 54 and outputs the A/D-converted voltage Vtemp to the controller 56.

The controller 56 generates the gate control signals VTu, VTv, VTw, VBu, VBv, and VBw, the control signal CTL1 for controlling ON/OFF of the switch 70 of the sample hold circuit 54, and the control signal CTL2 for controlling ON/OFF of the switches SWa, SWb, and SWc. Furthermore, the controller 56 performs protected operation, such as turning off all the field effect transistors Tr1 to Tr6, when the voltage Vtemp reaches an upper limit.

(Motor Control Method)

In the present embodiment, the three-phase motor M is driven by the 2-phase excitation method in which an electric current is made to flow only through two phases. In this case, two phases through which the motor current flows are switched for every electrical angle of 60 degrees by the inverter device 25.

Figure 10:
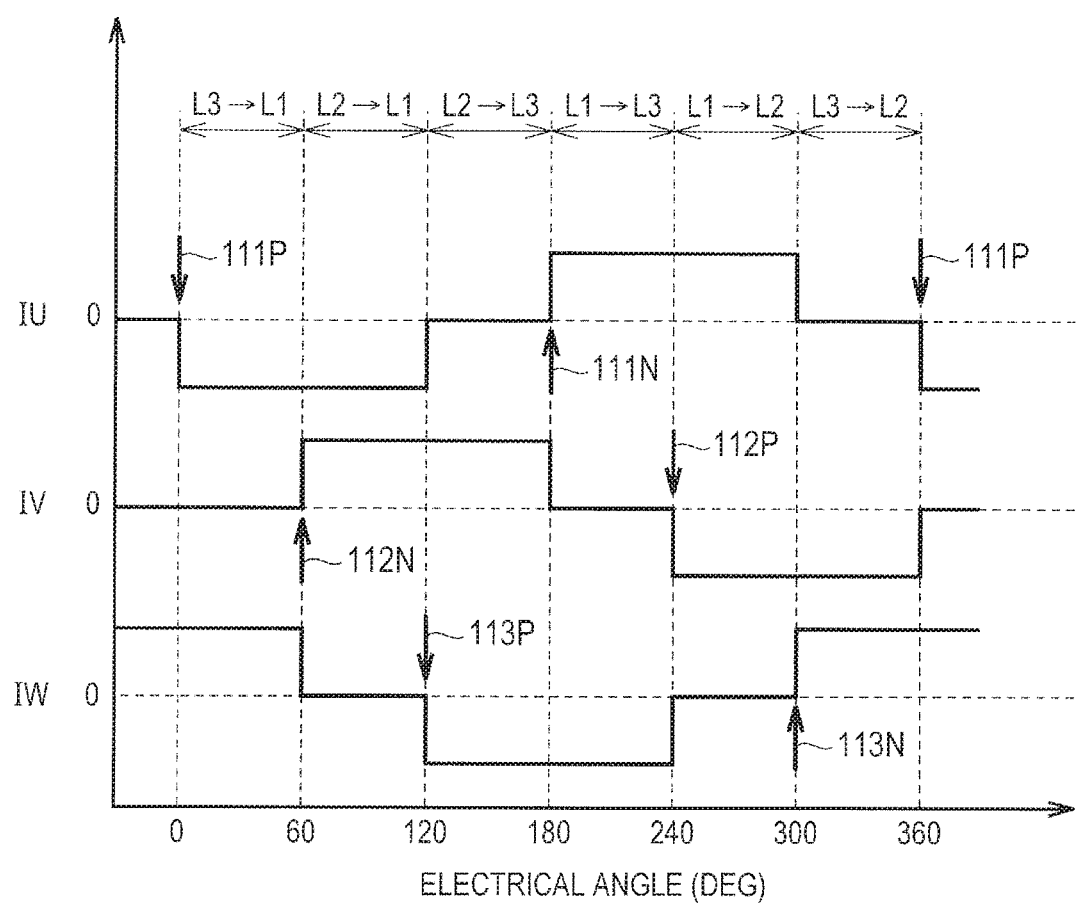
FIG. 10 is a drawing illustrating switching of energized phases of a motor current.

FIG. 10 illustrates switching of energized phases of the motor current. The horizontal axis of FIG. 10 indicates an electrical angle, and the vertical axis indicates the magnitude of the motor currents IU, IV, and IW schematically. As described above, when the motor currents IU, IV, and IW flow in the direction from the inverter device 25 to the three-phase motor M, the sign of the motor currents IU, IV, and IW is defined as positive.

With reference to FIG. 10, in the electrical angle from 0 to 60 degrees, the inverter device 25 is PWM-controlled to make the motor current flow in the direction from the stator winding L3 to the stator winding L1. Therefore, the value of the motor current IU is negative, the value of the motor current IV is 0, and the value of the motor current IW is positive.

In the electrical angle from 60 to 120 degrees, the inverter device 25 is PWM-controlled to make the motor current flow in the direction from the stator winding L2 to the stator winding L1. Therefore, the value of the motor current IU is negative, the value of the motor current IV is positive, and the value of the motor current IW is 0.

In the electrical angle from 120 to 180 degrees, the inverter device 25 is PWM-controlled to make the motor current flow in the direction from the stator winding L2 to the stator winding L3. Therefore, the value of the motor current IU is 0, the value of the motor current IV is positive, and the value of the motor current IW is negative.

In the electrical angle from 180 to 240 degrees, the inverter device 25 is PWM-controlled to make the motor current flow in the direction from the stator winding L1 to the stator winding L3. Therefore, the value of the motor current IU is positive, the value of the motor current IV is 0, and the value of the motor current IW is negative.

In the electrical angle from 240 to 300 degrees, the inverter device 25 is PWM-controlled to make the motor current flow in the direction from the stator winding L1 to the stator winding L2. Therefore, the value of the motor current IU is positive, the value of the motor current IV is negative, and the value of the motor current IW is 0.

In the electrical angle from 300 to 360 degrees, the inverter device 25 is PWM-controlled to make the motor current flow in the direction from the stator winding L3 to the stator winding L2. Therefore, the value of the motor current IU is 0, the value of the motor current IV is negative, and the value of the motor current IW is positive.

(Detection Timing of the Junction Temperature)

According to the motor control method illustrated in FIG. 10, when the forward voltage of the body diode of the field effect transistors Tr1 to Tr6 is detected in the period of the first dead time after switching the energized phase, the junction temperature can be detected without practically affecting the drive control of the three-phase motor M. This is because, in the state immediately after starting energization to a stator winding that is not energized until now, the magnitude of the electric current flowing through the stator winding concerned can be controlled to a current value (for example, about 1 to 2 A) that is smaller than the current value in the steady state. The small current value in this case is adjusted to a value suitable for the measurement of the forward voltage Vf of the body diode.

It is also preferable to detect the forward voltage of the body diode of the field effect transistor in the period of several dead times in the beginning after switching the energized phase, and to average the detected forward voltages. However, as explained in Embodiment 1, it should be noted that the detection of the junction temperature of the field effect transistor is performed at a time of changing to the regeneration period from the energization period to supply the electric power to the load from the power supply.

The following explains specifically the case of detecting the junction temperature of the field effect transistor Tr1 of the upper arm of the U phase directly coupled to the stator winding L1. In the present case, after switching from the energization in the direction from the stator winding L3 to the stator winding L2 to the energization in the direction from the stator winding L3 to the stator winding L1 (the timing 111P, at 0 degree of the electrical angle in FIG. 10), the dead time after switching the field effect transistor Tr2 from the ON state to the OFF state first until switching the field effect transistor Tr1 from the OFF state to the ON state is used for detection of the junction temperature.

The following explains the case of detecting the junction temperature of the field effect transistor Tr2 of the lower arm of the U phase directly coupled to the stator winding L1. In the present case, after switching from the energization in the direction from the stator winding L2 to the stator winding L3 to the energization in the direction from the stator winding L1 to the stator winding L3 (the timing 111N, at 180 degrees of the electrical angle in FIG. 10), the dead time after switching the field effect transistor Tr1 from the ON state to the OFF state first until switching the field effect transistor Tr2 from the OFF state to the ON state is used for detection of the junction temperature.

In the same manner, the following explains the case of detecting the junction temperature of the field effect transistor Tr3 of the upper arm of the V phase directly coupled to the stator winding L2. In the present case, after switching from the energization in the direction from the stator winding L1 to the stator winding L3 to the energization in the direction from the stator winding L1 to the stator winding L2 (the timing 112P, at 240 degrees of the electrical angle in FIG. 10), the dead time after switching the field effect transistor Tr4 from the ON state to the OFF state first until switching the field effect transistor Tr3 from the OFF state to the ON state is used for detection of the junction temperature.

The following explains the case of detecting the junction temperature of the field effect transistor Tr4 of the lower arm of the V phase directly coupled to the stator winding L2. In the present case, after switching from the energization in the direction from the stator winding L3 to the stator winding L1 to the energization in the direction from the stator winding L2 to the stator winding L1 (the timing 112N, at 60 degrees of the electrical angle in FIG. 10), the dead time after switching the field effect transistor Tr3 from the ON state to the OFF state first until switching the field effect transistor Tr4 from the OFF state to the ON state is used for detection of the junction temperature.

In the same manner, the following explains the case of detecting the junction temperature of the field effect transistor Tr5 of the upper arm of the W phase directly coupled to the stator winding L3. In the present case, after switching from the energization in the direction from the stator winding L2 to the stator winding L1 to the energization in the direction from the stator winding L2 to the stator winding L3 (the timing 113P, at 120 degrees of the electrical angle in FIG. 10), the dead time after switching the field effect transistor Tr6 from the ON state to the OFF state first until switching the field effect transistor Tr5 from the OFF state to the ON state is used for detection of the junction temperature.

The following explains the case of detecting the junction temperature of the field effect transistor Tr6 of the lower arm of the W phase directly coupled to the stator winding L3. In the present case, after switching from the energization in the direction from the stator winding L1 to the stator winding L2 to the energization in the direction from the stator winding L3 to the stator winding L2 (the timing 113N, at 300 degrees of the electrical angle in FIG. 10), the dead time after switching the field effect transistor Tr5 from the ON state to the OFF state first until switching the field effect transistor Tr6 from the OFF state to the ON state is used for detection of the junction temperature.

It should be noted that, according to the configuration of the device illustrated in FIG. 9, only the junction temperature of the transistors Tr1, Tr3, and Tr5 of the upper arm can be detected. However, when the differential amplifier 53 is enabled to detect the potential difference between the coupling nodes U, V, and W, and the low potential node 24 as explained in FIG. 7, it is possible to detect the junction temperature of the field effect transistors Tr2, Tr4, and Tr6 of the lower arm.

(Concrete Example of the Temperature Detection)

Hereinafter, the further explanation is made for the case of detecting the junction temperature of the field effect transistor Tr3 of the V-phase upper arm, in the first dead time after the timing 112P (at 240 degrees of the electrical angle in FIG. 10).

Figure 11A:
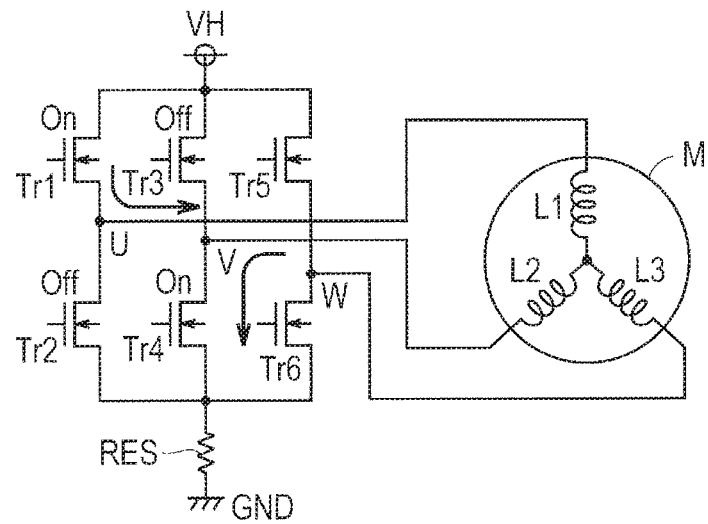
FIGS. 11A, 11B, and 11C are drawings illustrating a concrete example of the temperature detection method of a field effect transistor according to Embodiment 2.
Figure 11B:
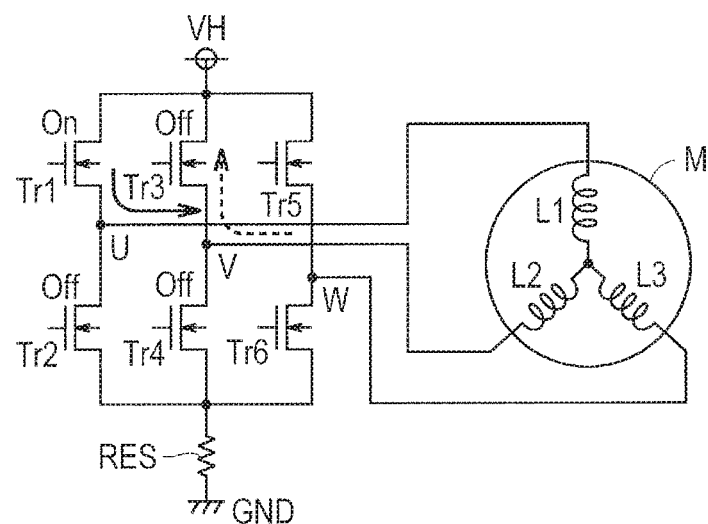
Figure 11C:
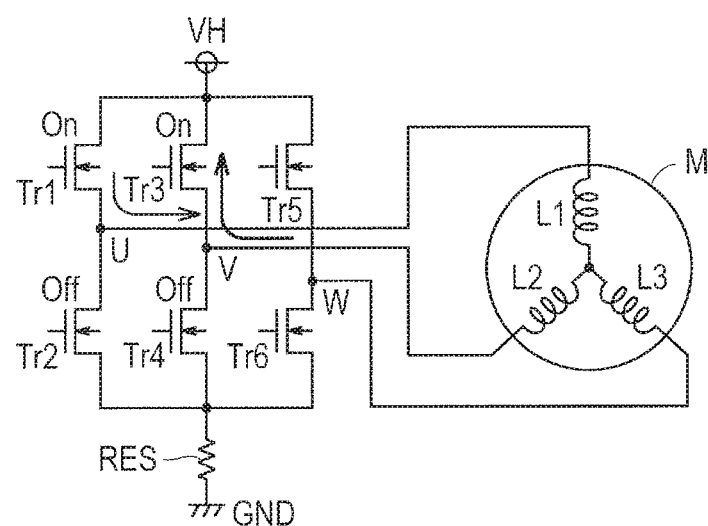

FIGS. 11A, 11B, and 11C illustrate the concrete example of the temperature detection method of the field effect transistor according to Embodiment 2.

FIG. 11A illustrates the case where the field effect transistors Tr1 and Tr4 are in the ON state and the field effect transistors Tr2, Tr3, Tr5, and Tr6 are in the OFF state. In the present case, the motor current flows through the highpotential-side field effect transistor Tr1, the stator winding L1, the stator winding L2, and the low-potential-side field effect transistor Tr4 in order.

With reference to FIG. 11B, it is assumed that the field effect transistor Tr4 is set to an OFF state from the state of FIG. 11A. In the present case, the circulating current (also called a regenerative current) flows through the high-potential-side field effect transistor Tr1, the stator winding L1, the stator winding L2, and the body diode of the high-potential-side field effect transistor Tr3 in order. Therefore, it is possible to detect the junction temperature of the field effect transistor Tr3, based on the temperature characteristic of the body diode.

With reference to FIG. 11C, it is assumed that the field effect transistor Tr3 is set to an ON state from the state of FIG. 11B. In the present case, the circulating current (regenerative current) flows through the high-potential-side field effect transistor Tr1, the stator winding L1, the stator winding L2, and the channel region of the high-potential-side field effect transistor Tr3.

Then, the state returns to the energized state illustrated in FIG. 11A via the state of the dead time illustrated in FIG. 11B. However, in the dead time after the state illustrated in FIG. 11C, the detection of the junction temperature of the field effect transistor Tr3 is not performed. This point is the same as in Embodiment 1.

Figure 12:
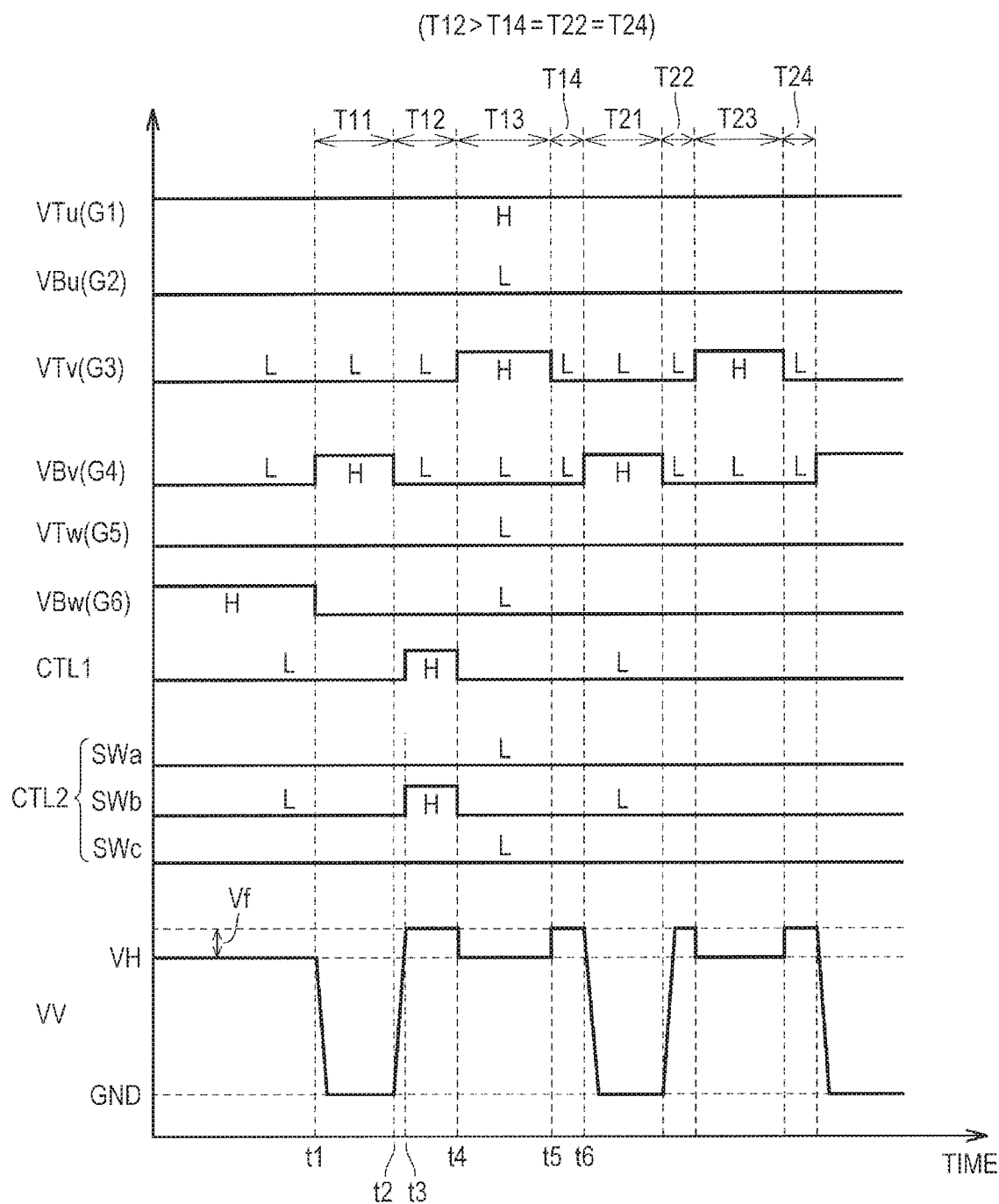
FIG. 12 is a timing chart illustrating the temperature detection procedure of a field effect transistor according to Embodiment 2.

FIG. 12 is a timing chart illustrating the temperature detection procedure of the field effect transistor according to Embodiment 2. FIG. 12 illustrates schematically the waveform of the control signals and the waveform of the potential VV of the coupling node V in the neighborhood of the timing 112P (240 degrees of the electrical angle) illustrated in FIG. 10. Hereinafter, with reference to FIG. 9 and FIG. 12 mainly, the operation of the semiconductor device 50C in case of detecting the junction temperature of the field effect transistor Tr3 is explained.

In the immediately preceding period of Time t1 (corresponding to 240 degrees of the electrical angle in FIG. 10), the controller 56 controls the inverter device 25 to make the energization current flow in the direction from the stator winding L1 to the stator winding L3. In this state, the controller 56 sets the gate control signals VTu and VBw at the H level, and sets the gate control signals VBu, VTv, VBv, and VTw at the L level. According to this setting, the motor current flows through the field effect transistor Tr1, the stator winding L1, the stator winding L3, and the field effect transistor Tr6 in order.

At Time t1, the controller 56 switches the gate control signal VBv from the L level to the H level, and switches the gate control signal VBw from the H level to the L level. According to this switching, the low-potential-side field effect transistor Tr4 of the V phase changes from the OFF state to the ON state, and the low-potential-side field effect transistor Tr6 of the W phase changes from the ON state to the OFF state. As a result, the potential VV of the coupling node V falls to the ground potential GND.

The state of the control signal described above is maintained during Period T11 from Time t1 to Time t2. Therefore, during Period T11, the motor current (that is, the energization current) flows in the direction from the stator winding L1 to the stator winding L2 as illustrated in FIG. 11A, and the value of the electric current flowing through the stator winding L2 increases from 0 gradually. Although not illustrated in FIG. 11A, the electric current that has been flowing through the stator winding L3 in the immediately preceding period of Time t1 flows through the body diode of the field effect transistor Tr5 as the circulating current, and the current value thereof decreases gradually.

At Time t2, the controller 56 switches the gate control signal VBv from the H level to the L level. By this switching, the low-potential-side field effect transistor Tr4 of the V phase changes from the ON state to the OFF state, and the potential VV of the coupling node V rises from the ground potential GND. The state of the control signal described above is maintained during Period T12 from Time t2 to Time t4. Therefore, the circulating current illustrated in FIG. 11B flows during Period T12. This circulating current flows through the body diode of the field effect transistor Tr3. Therefore, the potential VV of the coupling node V finally reaches a value that is higher than the potential VH of the high potential node 21, by the forward voltage Vf of the body diode.

Taking into consideration the delay time until the potential VV of the coupling node V reaches the maximum value, the forward voltage Vf of the body diode of the field effect transistor Tr3 is detected in the period from Time t3 after a prescribed period of time from Time t2, to Time t4. Specifically, the controller 56 controls the control signals CTL1 and CTL2 to set the switch 70 of the sample hold circuit 54 and the switch SWb in the ON state. According to this setting, the source-drain voltage of the field effect transistor Tr3 (that is, the forward voltage Vf of the body diode) is detected by the differential amplifier 53. Then, the voltage Vtemp outputted from the differential amplifier 53 is sampled by the sample hold circuit 54 and is held by the capacitor 71. The controller 56 detects the junction temperature of the field effect transistor Tr3 based on the voltage Vtemp held by the capacitor 71.

Here, the voltage detected changes corresponding to the electric current flowing through the body diode. Therefore, it is necessary to control the magnitude of the motor current IV flowing through the stator winding L2 at Time t2 immediately before being switched to Period T12, to a predetermined value. This value can be adjusted by the length of Period T11 (that is, the duty factor corresponding to a carrier frequency).

At next Time t4, the controller 56 switches the gate control signal VTv from the L level to the H level. According to this switching, the state of the high-potential-side field effect transistor Tr3 changes from the OFF state to the ON state. Therefore, as illustrated in FIG. 11C, the path of the circulating current changes to the path (103 in FIG. 2 and FIG. 3) that passes the N-type channel region of the field effect transistor Tr3. At Time t4, the controller 56 controls the control signals CTL1 and CTL2, to terminate the sampling of the source-drain voltage of the field effect transistor Tr3. The state of the control signal outputted from the controller 56 is maintained during Period T13 from Time t4 to Time t5.

At next Time t5, the controller 56 switches the gate control signal VTv from the H level to the L level. According to this switching, the high-potential-side field effect transistor Tr3 changes from the ON state to the OFF state. Therefore, as illustrated in FIG. 11B, the path of the circulating current changes to the path (102 illustrated in FIG. 2 and FIG. 3) that passes along the body diode. The state of the control signal outputted from the controller 56 is maintained during Period T14 from Time t5 to Time t6.

Different from the case of Period T12, in Period T14, the sampling of the source-drain voltage of the field effect transistor Tr1 is not performed. The circulating current flowing through the stator winding L2 gradually attenuates in Periods T12, T13, and T14 (it attenuates to 0 depending on conditions); accordingly, it is difficult to make a precise measurement of the forward voltage Vf of the body diode in Period T14. This is the reason of not performing the sampling in Period T14.

Periods T11 to T14 correspond to one cycle of the PWM signal. Periods T21 to T24 correspond to Periods T11 to T14, respectively, and the same control is repeated.

In the case of FIG. 12, the measurement of the junction temperature of the field effect transistor Tr3 is performed only in Period T12. In this case, among the dead time periods T12, T14, T22, and T24, the length of Period T12 when the measurement of the junction temperature is performed needs to be lengthen by the time necessary for the sampling of the voltage Vtemp. On the other hand, it is desirable to make short the length of other periods 114, T22, and 124 as much as possible, in order to reduce the loss and to suppress the heat generation of each field effect transistor Tr. Therefore, the length of Period T12 is longer than the length of Periods 114, T22, and T24.

When the delay time of the differential amplifier 53 is short enough and the sampling rate of the sample hold circuit 54 and the A/D conversion speed of the A/D converter 55 are sufficiently fast, or when the loss in the current path via the body diode does not cause a problem, the length of Periods T12, 114, T22, and 124 may be set equal mutually.

(Operation of the Controller)

Hereinafter, the explanation made so far is summarized and the operation of the controller 56 illustrated in FIG. 9 is explained.

Figure 13:
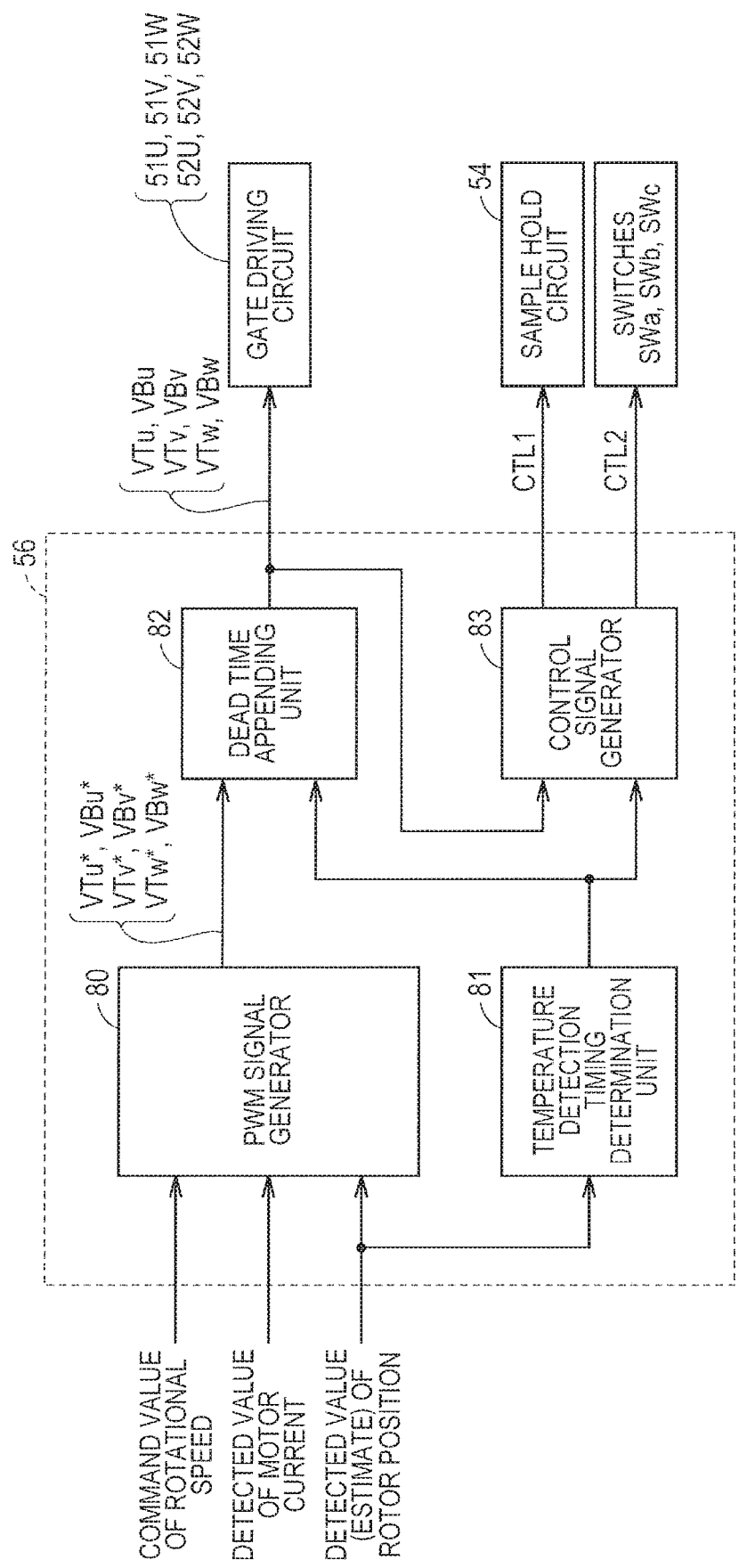
FIG. 13 is a functional block diagram illustrating operation of a controller.

FIG. 13 is a functional block diagram illustrating operation of the controller. With reference to FIG. 13, the controller 56 is comprised of a PWM signal generator 80, a temperature detection timing determination unit 81, a dead time appending unit 82, and a control signal generator 83.

The PWM signal generator 80 acquires periodically the information on the detection value of the motor currents IU, IV, and IW, and the detection value of the position of a rotor. In order to detect the motor current, a current detecting resistor may be inserted in an electric line of each phase between the inverter device 25 and the three-phase motor M for example or, alternatively, a current detecting resistor may be provided between the low potential node 24 and each of the field effect transistors Tr2, Tr4, and Tr6 of the lower arm of the inverter device 25. In order to detect the position of the rotor, a Hall element or a resolver may be provided in the three-phase motor M or, alternatively, the position of the rotor may be estimated based on the motor currents IU, IV, and IW (called a sensorless system).

When controlling the rotational speed, the PWM signal generator 80, generates the gate control signals VTu*, VBu*, VTv*, VBv*, VTw*, and VBw* in the PWM form, based on the detection value of the motor currents IU, IV, and IW and the detection value of the position of the rotor, so that the measured value becomes equal to the command value of the rotational speed supplied from the exterior. The dead time is not appended at this point in time.

The temperature detection timing determination unit 81 determines the timing to detect the junction temperature of the field effect transistor of each phase, based on the detection value of the position of the rotor. Specifically, as explained in FIG. 10, the temperature detection timing determination unit 81 outputs a signal indicating that the temperature detection is in process, for the prescribed period of times (or the prescribed number of PWM cycles) from the timing at which the motor current supply to the stator windings L1, L2, and L3 is switched.

The dead time appending unit 82 appends a dead time to the gate control signals VTu*, VBu*, VTv*, VBv*, VTw*, and VBw*, outputted from the PWM signal generator 80 and generates the gate control signal VTu, VBu, VTv, VBv, VTw, and VBw to be outputted to the gate driving circuits 51U, 52U, 51V, 52V, 51W, and 52W, respectively. Specifically, the dead time is appended when one transistor of two field effect transistors (Tr1, Tr2; Tr3, Tr4; Tr5, Tr6) mutually coupled in series between the high potential node 21 and the low potential node 24 is switched from the ON state to the OFF state and when the other transistor is switched from the OFF state to the ON state. In this case, after the lapse of the dead time after one transistor is switched to the OFF state, the other transistor is switched to the ON state.

The length of the dead time to be appended varies depending on whether the junction temperature of the field effect transistor is under detection. Specifically, the length of the dead time when the differential amplifier 53 is detecting the potential difference between the corresponding nodes is longer than the length of the dead time when the differential amplifier 53 is not detecting the potential difference.

The control signal generator 83 generates a control signal CTL1 to be outputted to the sample hold circuit 54, and a control signal CTL2 to be outputted to the switches SWa, SWb, and SWc, based on the gate control signals VTu, VBu, VTv, VBv, VTw, and VBw, to which the dead time has been appended by the dead time appending unit 82, and based on the output of the temperature detection timing determination unit 81.

Each function of the PWM signal generator 80, the temperature detection timing determination unit 81, the dead time appending unit 82, and the control signal generator 83 described above may be realized by a microcomputer including a CPU, a memory, etc., may be realized by an FPGA, or may be realized by an exclusive-use circuit. Each of above-described functions may be realized by combining these circuits arbitrarily.

Figure 14:
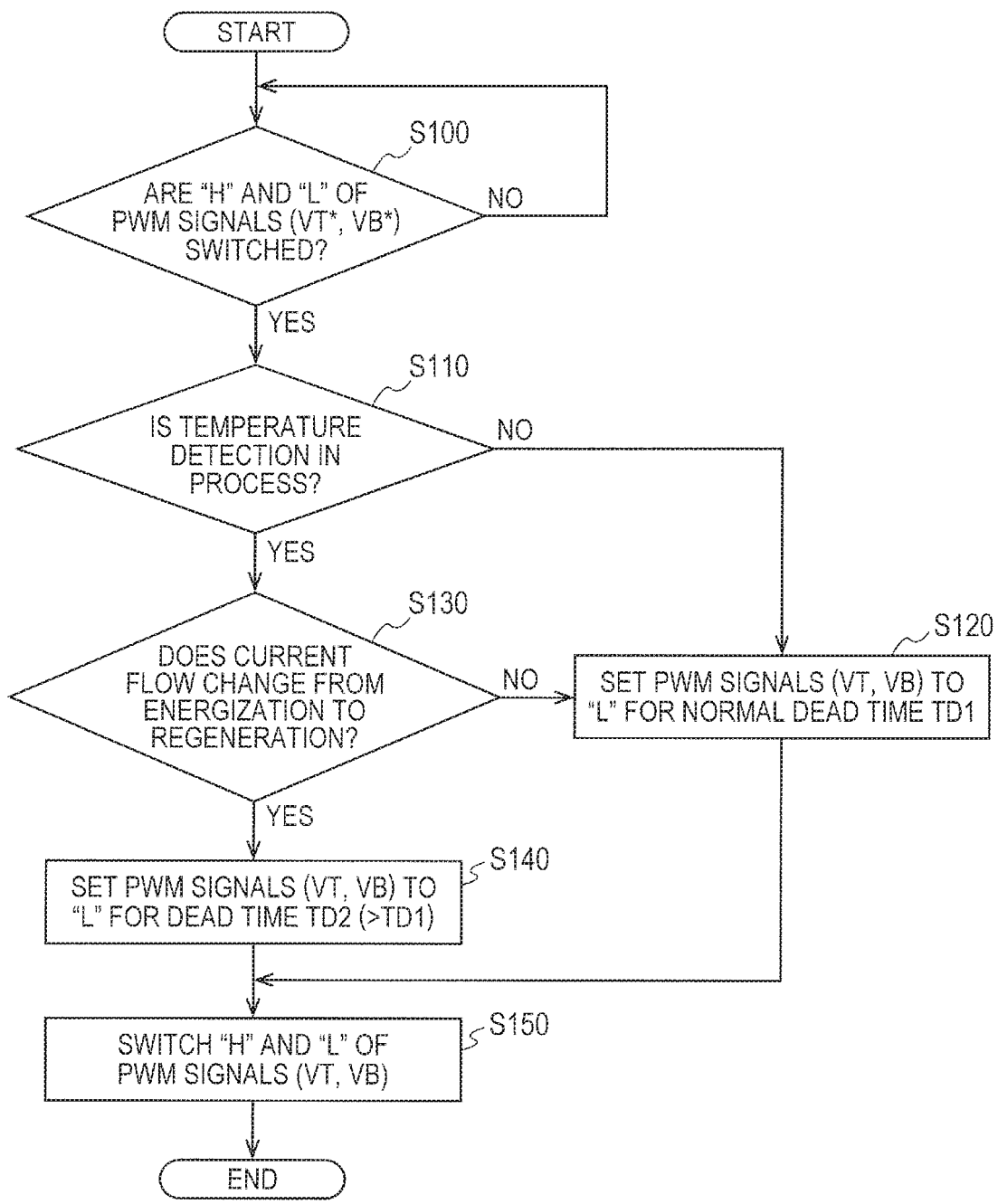
FIG. 14 is a flow chart illustrating operation of a dead time appending unit illustrated in FIG. 13.

FIG. 14 is a flowchart illustrating operation of the dead time appending unit illustrated in FIG. 13. With reference to FIG. 13 and FIG. 14, at Step S100, the dead time appending unit 82 determines whether it is the timing to switch the logical level about the PWM signals of each phase (VTu*, VBu*; VTv*, VBv*; VTw*, VBw*) received from the PWM signal generator 80.

When it is the timing to switch the logical level about the PWM signals of a certain phase (hereinafter, it is assumed to be X phase; X=U, V, W) (YES at Step S100), the dead time appending unit 82 determines further, at Step S110, whether the signal indicating that the temperature detection is in process is received from the temperature detection timing determination unit 81.

As a result of the above-described determination, when the signal indicating that the temperature detection is in process is received from the temperature detection timing determination unit 81 (YES at Step S110), the dead time appending unit 82 determines further whether the flow of the electric current to the three-phase motor M changes from the energization current to the regenerative current, by the change of the logical level of the PWM signal of the X phase.

Specifically, it is possible to determine that the energization current flows, based on the fact that the field effect transistor of the upper arm of any one phase is controlled in the ON state and the field effect transistor of the lower arm of another phase is controlled in the ON state. It is possible to determine that the regenerative current flows, based on the fact that any one of the field effect transistors that have been controlled in the ON state when the above-described energization current has been flowing is set to the OFF state.

When it is determined that the current flow has changed from the energization current to the regenerative current by the above-described determination (YES at Step S130), at Step S140, the dead time appending unit 82 sets to the L level both PWM signals VTx and VBx of the X phase for the dead time TD2 longer than the normal dead time TD1. On the other hand, when the temperature detection is not in process (NO at Step S110) or when the current flow does not change from the energization current to the regenerative current (NO at Step S130), at Step S120, the dead time appending units 82 sets to the L level both PWM signals VTx and VBx of the X phase for the normal dead time TD1.

After the lapse of the dead time (TD1 or TD2), the dead time appending unit 82 switches the H level and the L level of the PWM signals VTx and VBx of the X phase (Step S150).

(Effect)

According to the semiconductor device according to Embodiment 2, it is possible to detect the junction temperature of at least one of the MISFETs that configure the inverter device for controlling the three-phase motor, with a higher degree of accuracy than in the past. It is not necessary to employ sensors, such as a thermistor or a diode, for the temperature detection; accordingly, it is possible to reduce the number of parts that configure the system compared with the past.

By measuring the junction temperature in the period of the first dead time after switching the energized phase of the three-phase motor, it is possible to detect the junction temperature of the MISFET in real time, without practically affecting the operation of the three-phase motor.

Modified Example

The configuration of the bridge circuit that configures the power conversion device is not restricted in particular. For example, it is possible to apply the above-described detecting method of the junction temperature to the case of the H bridge (full bridge). Specifically, in the case of the H bridge, when it is assumed that the field effect transistors Tr5 and Tr6 and the stator winding L3 do not exist in FIGS. 11A, 11B, and 11C described above, the above-described explanation of the operation that refers to FIGS. 11A, 11B, and 11C is applicable as it is.

It is assumed that the field effect transistors Tr1 and Tr2 that configure the half bridge circuit 20 according to Embodiment 1 and the field effect transistors Tr1 to Tr6 that configure the inverter device 25 according to Embodiment 2 are all N-type transistors. However, all of these transistors may be P-type transistors. In this case, the logical level of the gate control signals VT and VB will be reversed from the case of the N-type transistors. However, the circuit regarding the temperature detection operates almost similarly to the case of the N-type transistors. As for the above-described field effect transistors Tr1 to Tr6, the N type and the P type may be intermingled.

As described above, the invention accomplished by the present inventors has been concretely explained based on the embodiments. However, it cannot be overemphasized that the present invention is not restricted to the embodiments as described above, and it can be changed variously in the range that does not deviate from the gist.

What is claimed is:

1. A semiconductor device to control a plurality of field effect transistors configuring a power conversion device, wherein each of the field effect transistors includes a body diode, wherein the power conversion device comprises:
a first power supply node and a second power supply node to supply mutually different reference potentials;
a first coupling node to couple to a load;
a first field effect transistor coupled between the first power supply node and the first coupling node; and
a second field effect transistor coupled between the second power supply node and the first coupling node, wherein the semiconductor device comprises:
a controller to control ON/OFF of each of the field effect transistors configuring the power conversion device by pulse width control;
a differential amplifier to detect the potential difference between the first coupling node and the first power supply node;
a first switch coupled between the first coupling node and a first input node of the differential amplifier; and
a sample hold circuit coupled to an output node of the differential amplifier, wherein, in a first period, the controller sets the first field effect transistor to an OFF state and the second field effect transistor to an ON state, to make a current flow between the first power supply node and the second power supply node through the load and the second field effect transistor, wherein, in a second period following the first period, the controller sets both of the first field effect transistor and the second field effect transistor to an OFF state, wherein, within the second period, the controller detects potential difference between the first coupling node and the first power supply node by means of the differential amplifier, and wherein, in the second period, the controller sets the first switch to an ON state to enable the sample hold circuit to sample the output of the differential amplifier.

2. The semiconductor device according to claim 1, wherein the power conversion device further comprises:
a second coupling node different from the first coupling node to couple to the load;
a third field effect transistor coupled between the first power supply node and the second coupling node; and
a fourth field effect transistor coupled between the second power supply node and the second coupling node, and wherein the differential amplifier detects potential difference between the second coupling node and the first power supply node.

3. The semiconductor device according to claim 2, wherein, in a first period, the controller sets the first field effect transistor and the fourth field effect transistor to an ON state and sets the second field effect transistor and the third field effect transistor to an OFF state, wherein, in a second period following the first period, the controller sets the first field effect transistor to an ON state and sets the second field effect transistor, the third field effect transistor, and the fourth field effect transistor to an OFF state, and wherein, within the second period, the controller detects potential difference between the second coupling node and the first power supply node by means of the differential amplifier.

4. The semiconductor device according to claim 3,
wherein the semiconductor device further comprises:
- a first switch coupled between the first coupling node and a first input node of the differential amplifier;
- a second switch coupled between the second coupling node and the first input node of the differential amplifier; and
- a sample hold circuit coupled to an output node of the differential amplifier, and wherein, in the second period, the controller sets the first switch to an OFF state and the second switch to an ON state to enable the sample hold circuit to sample the output of the differential amplifier.

5. The semiconductor device according to claim 2,
wherein the load is a star-connected three-phase motor including a first stator winding, a second stator winding, and a third stator winding, and the first coupling node is coupled to the first stator winding, and the second coupling node is coupled to the second stator winding,
wherein the power conversion device comprises:
- a third coupling node to couple to the third stator winding;
- a fifth field effect transistor coupled between the first power supply node and the third coupling node; and
- a sixth field effect transistor coupled between the second power supply node and the third coupling node, and wherein the differential amplifier detects potential difference between the third coupling node and the first power supply node.

6. The semiconductor device according to claim 5,
wherein, in a first period, the controller sets the first field effect transistor and the sixth field effect transistor to an ON state and sets the second field effect transistor, the third field effect transistor, the fourth field effect transistor, and the fifth field effect transistor to an OFF state,
wherein, in a second period following the first period, the controller sets the first field effect transistor and the fourth field effect transistor to an ON state and sets the second field effect transistor, the third field effect transistor, the fifth field effect transistor, and the sixth field effect transistor to an OFF state,
wherein, in a third period following the second period, the controller sets the first field effect transistor to an ON state and sets the second field effect transistor, the third field effect transistor, the fourth field effect transistor, the fifth field effect transistor, and the sixth field effect transistor to an OFF state, and
wherein, within the third period, the controller detects potential difference between the second coupling node and the first power supply node.

7. The semiconductor device according to claim 6,
wherein the semiconductor device further comprises:
- a first switch coupled between the first coupling node and a first input node of the differential amplifier;
- a second switch coupled between the second coupling node and the first input node of the differential amplifier;
- a third switch coupled between the third coupling node and the first input node of the differential amplifier; and
- a sample hold circuit coupled to an output node of the differential amplifier, and wherein, in the third period, the controller sets the first switch and the third switch to an OFF state and sets the second switch to an ON state, to enable the sample hold circuit to sample the output of the differential amplifier.

8. The semiconductor device according to claim 5,
wherein, in two transistors mutually coupled in series between the first power supply node and the second power supply node among the first through the sixth field effect transistor, when the controller switches one transistor from an ON state to an OFF state and switches the other transistor from an OFF state to an ON state, the controller switches the one transistor to the OFF state and switches the other transistor to the ON state after a lapse of dead time, and
wherein the controller detects the potential difference between the corresponding nodes by means of the differential amplifier within a period of the selected dead time.

9. The semiconductor device according to claim 8,
wherein the potential of the first power supply node is higher than the potential of the second power supply node, and
wherein after the controller switches from the energization in the direction from the first stator winding to the second stator winding, to the energization in the direction from the first stator winding to the third stator winding, the controller detects the potential difference between the third coupling node and the first power supply node by means of the differential amplifier, within a period of dead time after switching the sixth field effect transistor from the ON state to the OFF state until switching the fifth field effect transistor from the OFF state to the ON state.

10. The semiconductor device according to claim 8,
wherein the potential of the second power supply node is higher than the potential of the first power supply node, and
wherein after the controller switches from the energization in the direction from the first stator winding to the second stator winding, to the energization in the direction from the third stator winding to the second stator winding, the controller detects the potential difference between the third coupling node and the first power supply node by means of the differential amplifier, within a period of dead time after switching the sixth field effect transistor from the ON state to the OFF state until switching the fifth field effect transistor from the OFF state to the ON state.

11. The semiconductor device according to claim 8,
wherein a length of the dead time when the differential amplifier detects the potential difference between the corresponding nodes is longer than the length of the dead time when the differential amplifier does not detect the potential difference.

12. A power module comprising:
a first power supply node and a second power supply node to supply mutually different reference potentials;
a first coupling node for coupling to a load;
a first field effect transistor coupled between the first power supply node and first coupling node; and
a second field effect transistor coupled between the second power supply node and the first coupling node,
wherein each of the first field effect transistor and the second field effect transistor includes a body diode,
wherein the power module further comprises:
- a controller to control ON/OFF of each of the field effect transistors by pulse width control;

a differential amplifier to detect the potential difference between the first coupling node and first power supply node;
a first switch coupled between the first coupling node and a first input node of the differential amplifier; and
a sample hold circuit coupled to an output node of the differential amplifier,
wherein, in a first period, the controller sets the first field effect transistor to an OFF state and the second field effect transistor to an ON state, to make a current flow between the first power supply node and the second power supply node through the load and the second field effect transistor,
wherein, in a second period following the first period, the controller sets both of the first field effect transistor and the second field effect transistor to an OFF state,
wherein, within the second period, the controller detects potential difference between the first coupling node and the first power supply node by means of the differential amplifier, and
wherein, in the second period, the controller sets the first switch to an ON state to enable the sample hold circuit to sample the output of the differential amplifier.

13. A control method of a power conversion device, wherein the power conversion device comprises:
a first power supply node and a second power supply node to supply mutually different reference potentials;
a first coupling node to couple to a load;
a first field effect transistor coupled between the first power supply node and the first coupling node; and
a second field effect transistor coupled between the second power supply node and the first coupling node,
wherein each of the field effect transistors includes a body diode,
a first switch coupled between the first coupling node and a first input node of a differential amplifier; and
a sample hold circuit coupled to an output node of the differential amplifier,
wherein the control method comprises the steps of:
setting the first field effect transistor to an OFF state and the second field effect transistor to an ON state in a first period to make a current flow between the first power supply node and the second power supply node through the load and the second field effect transistor;
setting both of the first field effect transistor and the second field effect transistor to an OFF state in a second period following the first period; and
detecting potential difference between the first coupling node and the first power supply node by the differential amplifier within the second period; and setting the first switch to an ON state to sample the output of the differential amplifier in the second period.

* * * * *